(12) United States Patent
Nakamura

(10) Patent No.: US 7,858,497 B2
(45) Date of Patent: Dec. 28, 2010

(54) STACKED DEVICE MANUFACTURING METHOD

(75) Inventor: Masaru Nakamura, Ota-ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/576,010

(22) Filed: Oct. 8, 2009

(65) Prior Publication Data

US 2010/0099221 A1    Apr. 22, 2010

(30) Foreign Application Priority Data

Oct. 22, 2008    (JP)    ............................. 2008-272272

(51) Int. Cl.
*H01L 21/78* (2006.01)
*H01L 21/46* (2006.01)
*H01L 21/301* (2006.01)

(52) U.S. Cl. .................. 438/462; 438/109; 438/460; 438/461; 438/463; 438/464; 257/E21.499; 257/E21.599

(58) Field of Classification Search .......... 257/E21.499, 257/E21.599
See application file for complete search history.

(56) References Cited

U.S. PATENT DOCUMENTS

| | | | |
|---|---|---|---|
| 7,608,481 B2 * | 10/2009 | Masuda | ..................... 438/109 |
| 7,622,366 B2 * | 11/2009 | Nakamura | ................... 438/463 |
| 2007/0218593 A1 * | 9/2007 | Masuda | ...................... 438/127 |
| 2009/0218593 A1 * | 9/2009 | Kamikawa et al. | .......... 257/103 |

FOREIGN PATENT DOCUMENTS

JP    A 60-206058    10/1985

* cited by examiner

*Primary Examiner*—Savitri Mulpuri
*Assistant Examiner*—Mohsen Ahmadi
(74) *Attorney, Agent, or Firm*—Greer, Burns & Crain, Ltd.

(57) ABSTRACT

A stacked device manufacturing method including a kerf forming step of forming a kerf on the front side of each of plural wafers along each street, the kerf having a depth corresponding to a predetermined finished thickness of each wafer, a first stacking step of stacking a first one of the wafers and a second one of the wafers in such a manner that the front side of the second wafer is opposed to the front side of the first wafer and that the electrodes of the second wafer are respectively bonded to the electrodes of the first wafer, a first back grinding step of grinding the back side of the second wafer to expose each kerf of the second wafer to the back side of the second wafer, a second stacking step of stacking a third one of the wafers to the second wafer in such a manner that the front side of the third wafer is opposed to the back side of the second wafer and that the electrodes of the third wafer are respectively bonded to the electrodes of the second wafer, and a second back grinding step of grinding the back side of the third wafer to expose each kerf of the third wafer to the back side of the third wafer.

9 Claims, 22 Drawing Sheets

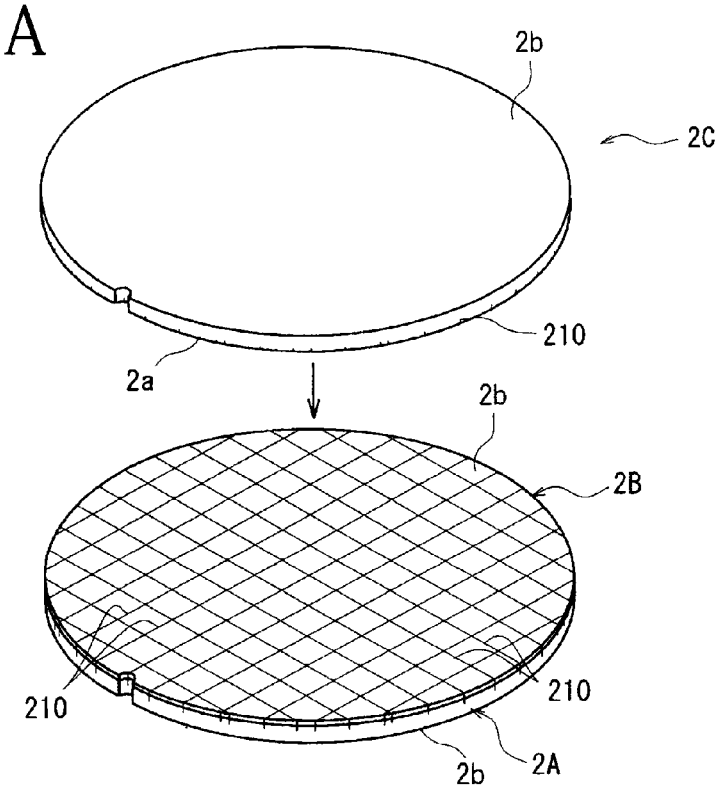
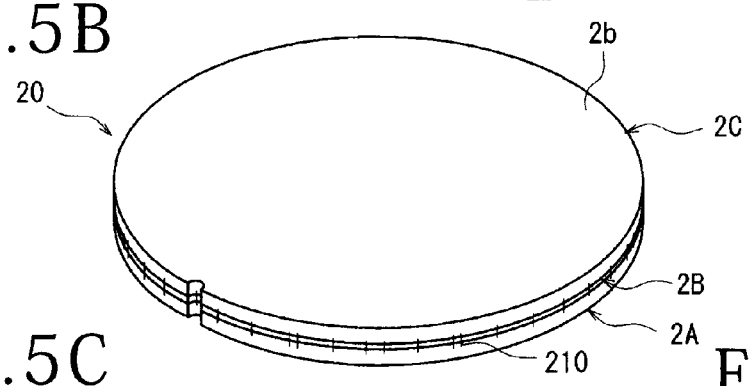
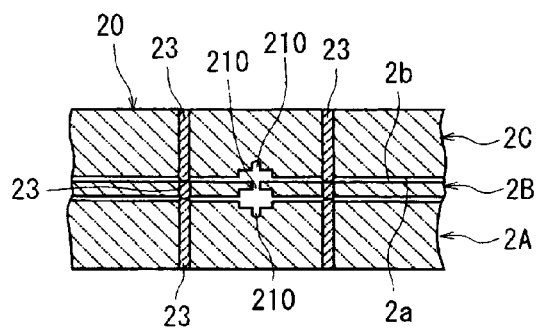 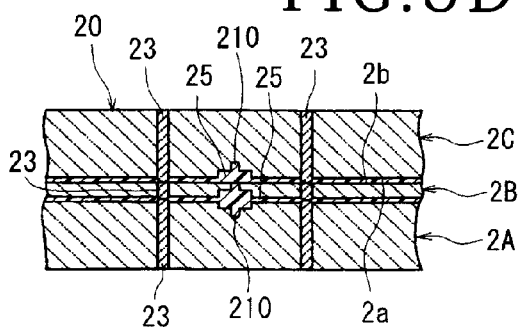

STACKED DEVICE MANUFACTURING METHOD

BACKGROUND OF THE INVENTION

1. Field of the Invention

The present invention relates to a manufacturing method for a stacked device composed of a plurality of semiconductor chips stacked together, each semiconductor chip being formed with a device such as IC and LSI on the front side.

2. Description of the Related Art

In a semiconductor device fabrication process, a plurality of crossing streets (division lines) are formed on the front side of a substantially disk-shaped semiconductor wafer to partition a plurality of regions where devices such as ICs and LSIs are respectively formed. The semiconductor wafer having the devices in the partitioned regions is divided along the streets to manufacture a plurality of individual semiconductor chips. For the purposes of size reduction and higher functionality of equipment, a stacked device composed of a plurality of semiconductor chips stacked together has been put to practical use. This stacked device is manufactured by stacking a plurality of semiconductor wafers each formed with a plurality of devices on the front side to obtain a stacked wafer and next cutting this stacked wafer along the streets (see Japanese Patent Laid-open No. Sho 60-206058, for example).

If the thickness of each semiconductor wafer is reduced to 50 μm or less, for example, by grinding to further reduce the size of each stacked device, there is a problem such that each semiconductor wafer is easily broken, so that the lamination of the plural semiconductor wafers becomes difficult. Further, if the stacked wafer formed by stacking a plurality of semiconductor wafers each reduced in thickness is cut along each street by using a cutting blade, there is a problem such that the side surface of each stacked device may become chipped to cause a degradation in quality of each stacked device.

SUMMARY OF THE INVENTION

It is therefore an object of the present invention to provide a stacked device manufacturing method which can obtain a stacked device reduced in thickness without chipping of the side surface of the stacked device.

In accordance with an aspect of the present invention, there is provided a stacked device manufacturing method for manufacturing a plurality of individual stacked devices by stacking a plurality of wafers to form a stacked wafer and next dividing the stacked wafer into the individual stacked devices along a plurality of crossing streets formed on the front side of each wafer, wherein each wafer has a plurality of devices respectively formed in a plurality of regions partitioned by the streets and a plurality of electrodes extending from the front side to the back side of each region, the stacked device manufacturing method including a kerf forming step of forming a kerf on the front side of each wafer along each street prior to grinding the back side of each wafer to thereby reduce the thickness of each wafer to a predetermined finished thickness, the kerf having a depth corresponding to the predetermined finished thickness from the front side of each wafer; a first stacking step of stacking a first one of the wafers and a second one of the wafers after performing the kerf forming step in such a manner that the front side of the second wafer is opposed to the front side of the first wafer and that the electrodes of the second wafer are respectively bonded to the electrodes of the first wafer; a first back grinding step of grinding the back side of the second wafer to expose each kerf of the second wafer to the back side of the second wafer after performing the first stacking step; a second stacking step of stacking a third one of the wafers subjected to the kerf forming step to the second wafer after performing the first back grinding step in such a manner that the front side of the third wafer is opposed to the back side of the second wafer and that the electrodes of the third wafer are respectively bonded to the electrodes of the second wafer; a second back grinding step of grinding the back side of the third wafer to expose each kerf of the third wafer to the back side of the third wafer after performing the second stacking step; and a third back grinding step of grinding the back side of the first wafer to expose each kerf of the first wafer to the back side of the first wafer after performing the second back grinding step.

Preferably, in the first stacking step, the front side of the second wafer stacked on the front side of the first wafer is bonded thereto through an adhesive, and in the second stacking step, the front side of the third wafer subjected to the kerf forming step is bonded through an adhesive to the back side of the second wafer after performing the first back grinding step. In this case, the stacked device manufacturing method further includes an adhesive separating step of separating the adhesive filled in each kerf of each of the first to third wafers after performing the third back grinding step.

Preferably, the second stacking step and the second back grinding step are repeated.

In addition, preferably, the stacked device manufacturing method further includes a wafer supporting step of attaching the back side of the third wafer to the front side of a dicing tape supported to an annular frame after performing the second back grinding step and before performing the third back grinding step.

In accordance with another aspect of the present invention, there is provided a stacked device manufacturing method for manufacturing a plurality of individual stacked devices by stacking a plurality of wafers to form a stacked wafer and next dividing the stacked wafer into the individual stacked devices along a plurality of crossing streets formed on the front side of each wafer, wherein each wafer has a plurality of devices respectively formed in a plurality of regions partitioned by the streets and a plurality of electrodes extending from the front side to the back side of each region, the stacked device manufacturing method including a modified layer forming step of applying a laser beam to each wafer along each street to thereby form a modified layer in each wafer along each street so that the modified layer is exposed to the front side of each wafer, prior to grinding the back side of each wafer to thereby reduce the thickness of each wafer to a predetermined finished thickness; a first stacking step of stacking a first one of the wafers and a second one of the wafers after performing the modified layer forming step in such a manner that the front side of the second wafer is opposed to the front side of the first wafer and that the electrodes of the second wafer are respectively bonded to the electrodes of the first wafer; a first back grinding step of grinding the back side of the second wafer to reduce the thickness of the second wafer to the predetermined finished thickness after performing the first stacking step; a second stacking step of stacking a third one of the wafers subjected to the modified layer forming step to the second wafer after performing the first back grinding step in such a manner that the front side of the third wafer is opposed to the back side of the second wafer and that the electrodes of the third wafer are respectively bonded to the electrodes of the second wafer; a second back grinding step of grinding the back side of the third wafer to reduce the thickness of the third wafer to the predetermined finished thickness after performing the second stacking step; a third back grinding step of grinding the back side of the first wafer to reduce the thickness of the first wafer to the predetermined finished thickness after performing the second back grinding step; and a dividing step of applying an external force to the stacked wafer after performing the third back grinding step to thereby divide the stacked wafer along each modified layer formed in each of the first to third wafers.

Preferably, in the first stacking step, the front side of the second wafer stacked on the front side of the first wafer is bonded thereto through an adhesive, and in the second stacking step, the front side of the third wafer subjected to the modified layer forming step is bonded through an adhesive to the back side of the second wafer after performing the first back grinding step.

Preferably, the second stacking step and the second back grinding step are repeated.

Preferably, the stacked device manufacturing method further includes a wafer supporting step of attaching the back side of the third wafer to the front side of a dicing tape supported to an annular frame after performing the second back grinding step and before performing the third back grinding step.

In the stacked device manufacturing method according to the present invention, the plural wafers each formed with a kerf having a depth corresponding to the predetermined finished thickness of each device are stacked together and the back side of each wafer is next ground to reduce the thickness of each wafer to the predetermined finished thickness. Accordingly, the lamination of the wafers can be easily performed and the thickness of each wafer can be reduced. Accordingly, the thickness of the stacked device can be minimized. Further, the stacked wafer reduced in thickness is divided by grinding the back side of each wafer to expose each kerf to the back side of each wafer. Accordingly, it is unnecessary to cut the stacked wafer by using a cutting blade, so that chipping of the side surface of the stacked device can be prevented.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 5A is a perspective view showing a second stacking step in the first preferred embodiment of the stacked device manufacturing method according to the present invention;

FIG. 5B is a perspective view showing a stacked wafer obtained by the second stacking step shown in FIG. 5A;

FIG. 5C is an enlarged sectional view showing the stacked wafer shown in FIG. 5B;

FIG. 5D is a view similar to FIG. 5C, showing a modification of the second stacking step shown in FIG. 5A;

DETAILED DESCRIPTION OF THE PREFERRED EMBODIMENTS

Some preferred embodiments of the stacked device manufacturing method according to the present invention will now be described in detail with reference to the attached drawings.

Figure 1A:
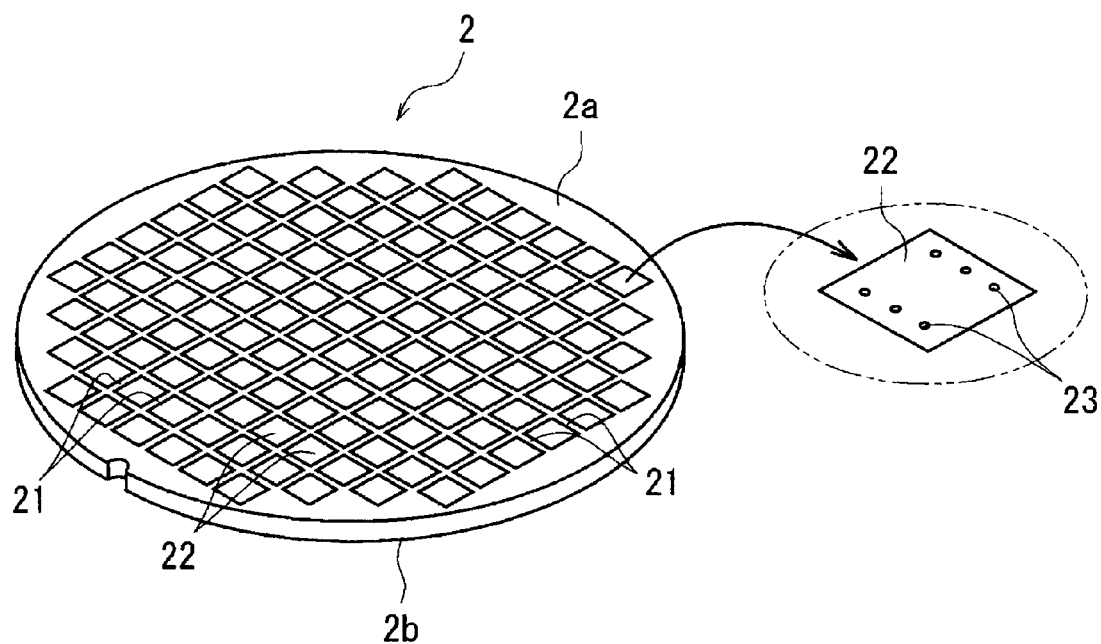
FIG. 1A is a perspective view showing a semiconductor wafer as a wafer.
Figure 1B:
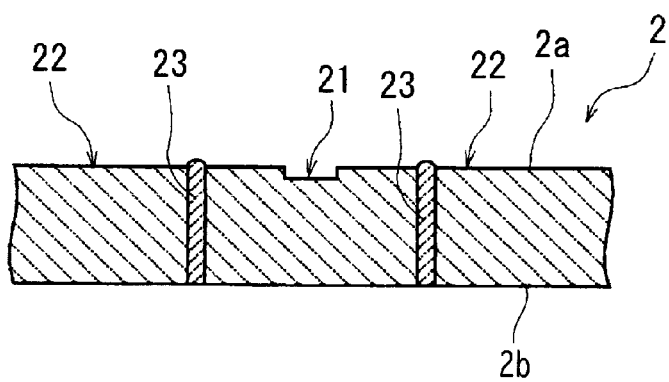
FIG. 1B is an enlarged sectional view of an essential part of the semiconductor wafer shown in FIG. 1A.

FIG. 1A is a perspective view of a semiconductor wafer 2 as a wafer. The semiconductor wafer 2 shown in FIG. 1A is a silicon wafer having a thickness of 600 µm, for example. The semiconductor wafer 2 has a front side 2a and a back side 2b. A plurality of crossing streets 21 are formed on the front side 2a of the semiconductor wafer 2 to thereby partition a plurality of rectangular regions where a plurality of devices 22 such as ICs and LSIs are respectively formed. As shown in FIG. 1B, each device 22 of the semiconductor wafer 2 is provided with a plurality of electrodes 23 extending from the front side 2a to the back side 2b.

A first preferred embodiment of the stacked device manufacturing method according to the present invention will now be described with reference to FIGS. 2A to 14B, wherein the semiconductor wafers 2 are stacked to form a stacked wafer and this stacked wafer is next divided along the streets to thereby obtain individual stacked devices. In the first preferred embodiment of the stacked device manufacturing method, a kerf forming step is first performed in the following manner prior to grinding the back side of each wafer to thereby reduce the thickness of each wafer to a predetermined finished thickness. The kerf forming step is performed to form a kerf having a depth corresponding to the predetermined finished thickness from the front side 2a along each street of the wafer 2. This kerf forming step is performed by using a cutting apparatus 3 shown in FIG. 2A. The cutting apparatus 3 shown in FIG. 2A includes a chuck table 31 for holding a workpiece, cutting means 32 for cutting the workpiece held on the chuck table 31, and imaging means 33 for imaging the workpiece held on the chuck table 31. The chuck table 31 is so configured as to hold the workpiece under suction. The chuck table 31 is movable in a feeding direction shown by an arrow X in FIG. 2A by a feeding mechanism (not shown) and also movable in an indexing direction shown by an arrow Y in FIG. 2A by an indexing mechanism (not shown).

The cutting means 32 includes a spindle housing 321 extending in a substantially horizontal direction, a rotating spindle 322 rotatably supported to the spindle housing 321, and a cutting blade 323 mounted on a front end portion of the rotating spindle 322. A servo motor (not shown) is provided in the spindle housing 321, and the rotating spindle 322 is rotatable by this servo motor in the direction shown by an arrow 322a in FIG. 2A. The imaging means 33 is mounted on a front end portion of the spindle housing 321, and includes illuminating means for illuminating the workpiece, an optical system for capturing an area illuminated by the illuminating means, and an imaging device (CCD) for imaging the area captured by the optical system. An image signal output from the imaging means 33 is transmitted to control means (not shown).

Figure 2A:
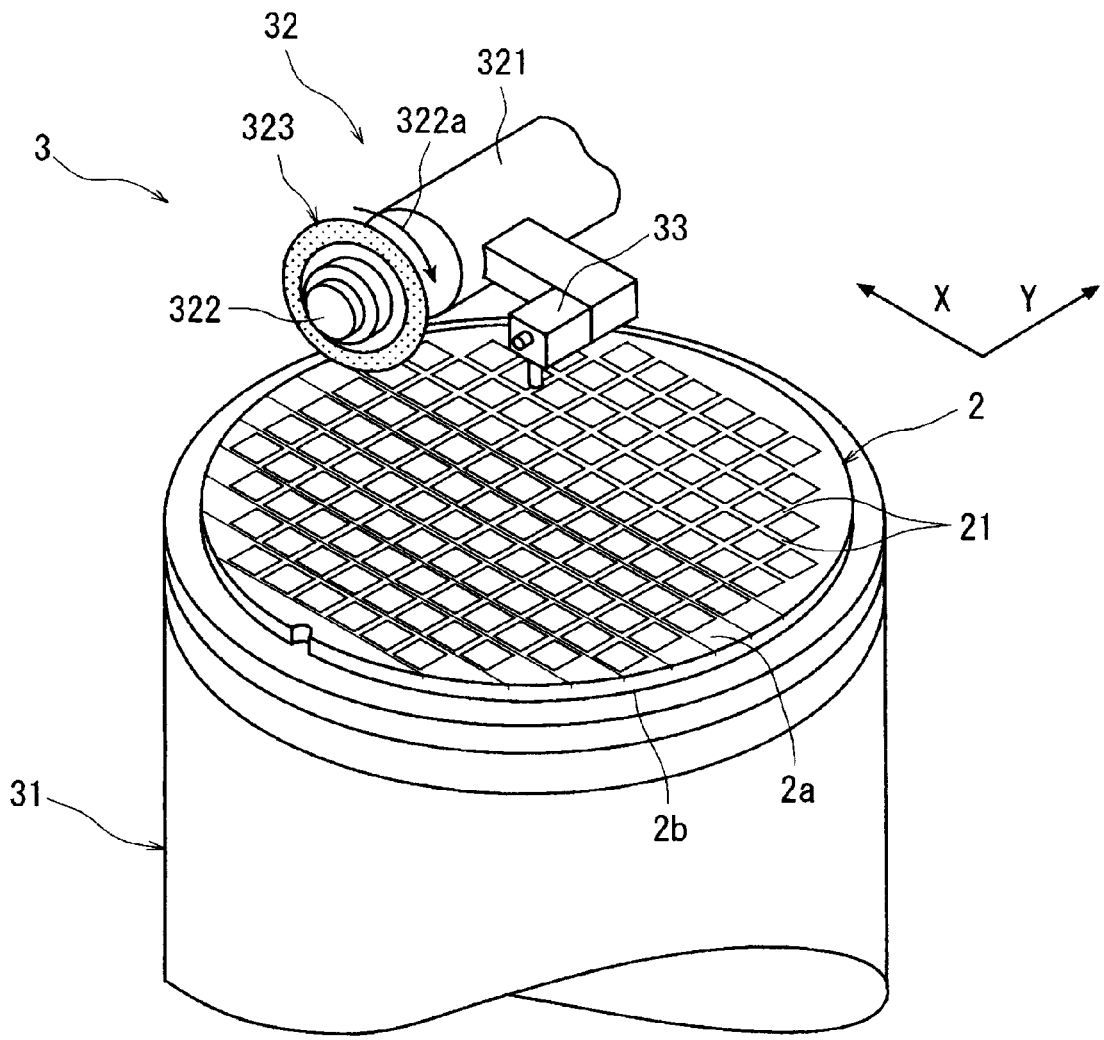
FIG. 2A is a perspective view showing a cutting apparatus for performing a kerf forming step in a first preferred embodiment of the stacked device manufacturing method according to the present invention.

The kerf forming step using the cutting apparatus 3 is performed in the following manner. As shown in FIG. 2A, the semiconductor wafer 2 is placed on the chuck table 31 in the condition where the back side 2b of the semiconductor wafer 2 comes into contact with the upper surface of the chuck table 31. By operating suction means (not shown), the semiconductor wafer 2 is held on the chuck table 31 under suction. Accordingly, the front side 2a of the semiconductor wafer 2 held on the chuck table 31 is oriented upward. The chuck table 31 thus holding the semiconductor wafer 2 is moved to a position directly below the imaging means 33 by the feeding mechanism.

When the chuck table 31 is positioned directly below the imaging means 33, an alignment operation is performed by the imaging means 33 and the control means to detect a cutting area where a kerf is to be formed along each street 21 of the semiconductor wafer 2. More specifically, the imaging means 33 and the control means perform image processing such as pattern matching for making the alignment between some of the streets 21 extending in a predetermined direction on the semiconductor wafer 2 and the cutting blade 323, thereby performing the alignment in the cutting area (alignment step). Similarly, the imaging means 33 and the control means perform the alignment in a cutting area for the other streets 21 extending in a direction perpendicular to the direction mentioned above on the semiconductor wafer 2.

Figure 2B:
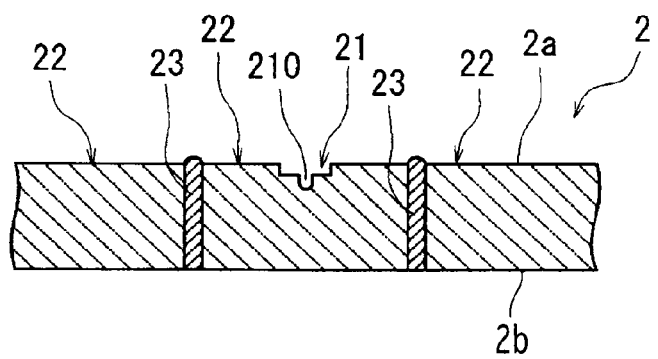
FIG. 2B is an enlarged sectional view of an essential part of a semiconductor wafer obtained by the kerf forming step using the cutting apparatus shown in FIG. 2A.

After performing such an alignment operation for detecting the cutting area of the semiconductor wafer 2 held on the chuck table 31, the chuck table 31 holding the semiconductor wafer 2 is moved to a cutting start position in the cutting area. At this cutting start position, the cutting blade 323 is rotated in the direction shown by the arrow 322a in FIG. 2A and simultaneously moved downward to a working position, thus performing an in-feed operation. This working position of the cutting blade 323 is set so that the outer circumference of the cutting blade 323 reaches a depth (e.g., 30 µm) from the front side 2a of the semiconductor wafer 2 corresponding to the finished thickness of the semiconductor wafer 2. After performing the in-feed operation of the cutting blade 323, the chuck table 31 is moved in the direction shown by the arrow X in FIG. 2A as rotating the cutting blade 323, thereby forming a kerf 210 having a depth (e.g., 30 µm) corresponding to the finished thickness of the semiconductor wafer 2 along one of the streets 21 as shown in FIG. 2B (kerf forming step). This kerf forming step is similarly performed along all of the streets 21 formed on the front side 2a of the semiconductor wafer 2. A plurality of semiconductor wafers 2 each subjected to this kerf forming step are prepared.

The kerf forming step for forming the kerf 210 having a depth from the front side 2a of the semiconductor wafer 2 along each street 21 corresponding to the predetermined finished thickness of the semiconductor wafer 2 may be performed by applying a laser beam having an absorption wavelength to the semiconductor wafer 2 along each street 21.

Figure 3A:
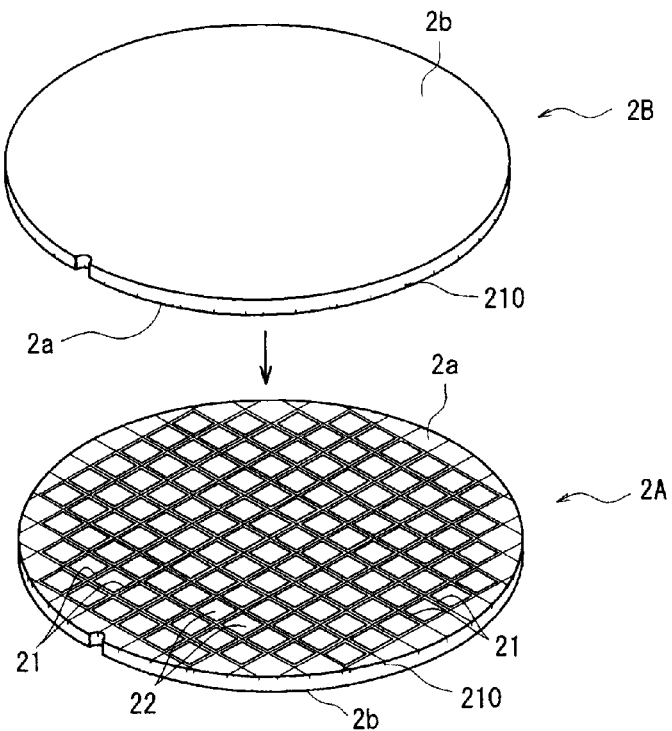
FIG. 3A is a perspective view showing a first stacking step in the first preferred embodiment of the stacked device manufacturing method according to the present invention.
Figure 3B:
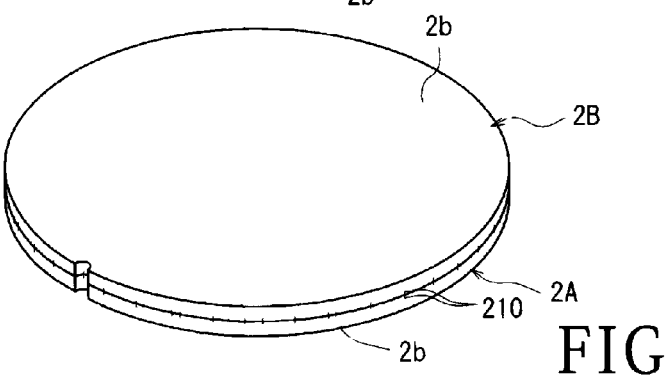
FIG. 3B is a perspective view showing a stacked wafer obtained by the first stacking step shown in FIG. 3A.
Figure 3C:
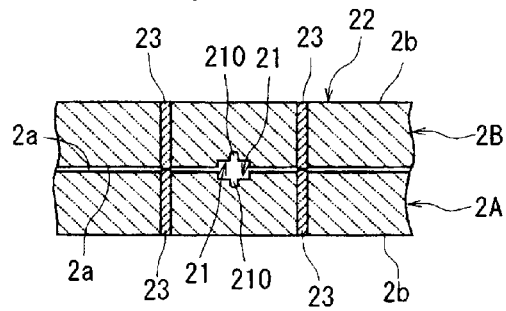
FIG. 3C is an enlarged sectional view showing an essential part of the stacked wafer shown in FIG. 3B.
Figure 3D:
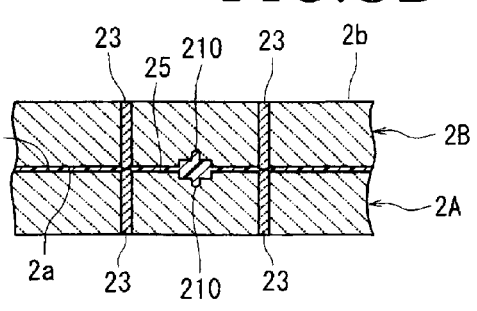
FIG. 3D is a view similar to FIG. 3C, showing a modification of the first stacking step shown in FIG. 3A.

After performing the kerf forming step for each semiconductor wafer 2, a first stacking step is performed in the following manner. A first wafer as a base wafer subjected to the kerf forming step and a second wafer subjected to the kerf forming step are stacked together in such a manner that the front side of the second wafer is opposed to the front side of the first wafer and that the electrodes of the second wafer are respectively bonded to the electrodes of the first wafer. More specifically, as shown in FIGS. 3A to 3C, a semiconductor wafer 2B subjected to the kerf forming step is stacked to a semiconductor wafer 2A as a base wafer subjected to the kerf forming step in such a manner that the front side 2a of the semiconductor wafer 2B is opposed to the front side 2a of the semiconductor wafer 2A and that the electrodes 23 of the semiconductor wafer 2B are respectively bonded to the electrodes 23 of the semiconductor wafer 2A. As a modification, the front side 2a of the semiconductor wafer 2B may be bonded through an anisotropic conductive adhesive (underfill material) 25 to the front side 2a of the semiconductor wafer 2A as a base wafer as shown in FIG. 3D. In this case, each kerf 210 of the semiconductor wafers 2A and 2B is filled with the anisotropic conductive adhesive 25.

After performing the first stacking step, a first back grinding step is performed in the following manner. The back side of the second wafer stacked to the first wafer as a base wafer by the first stacking step is ground to expose each kerf of the second wafer to the back side of the second wafer. The first back grinding step is performed by using a grinding apparatus 4 shown in FIG. 4A. The grinding apparatus 4 shown in FIG. 4A includes a chuck table 41 for holding a workpiece and grinding means 43 having a grinding wheel 42. The first back grinding step using the grinding apparatus 4 is performed in the following manner. The laminate of the semiconductor wafer 2A and the semiconductor wafer 2B is placed on the chuck table 41 in the condition where the back side 2b of the semiconductor wafer 2A as a base wafer comes into contact with the upper surface of the chuck table 41. By operating suction means (not shown), the laminate of the semiconductor wafer 2A and the semiconductor wafer 2B is held on the chuck table 41 under suction. Accordingly, the back side 2b of the semiconductor wafer 2B of the laminate held on the chuck table 41 is oriented upward.

Figure 4A:
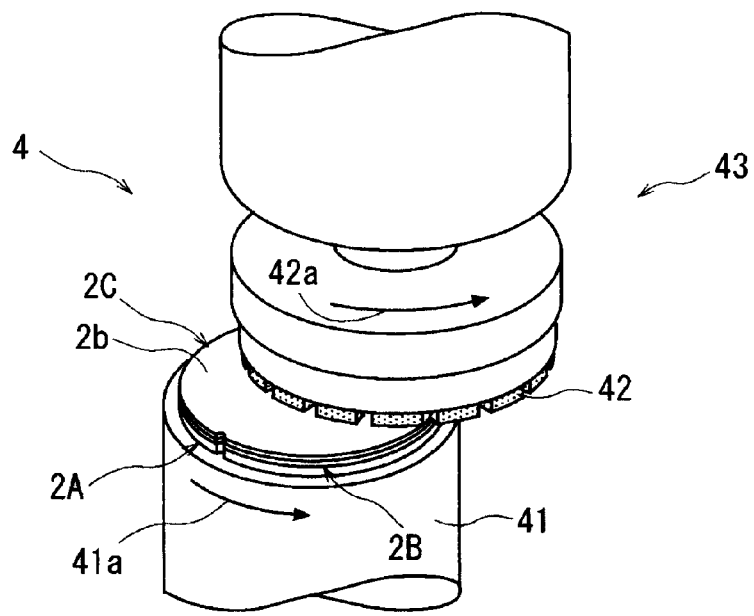
FIG. 4A is a perspective view showing a grinding apparatus for performing a first back grinding step in the first preferred embodiment of the stacked device manufacturing method according to the present invention.
Figure 4B:
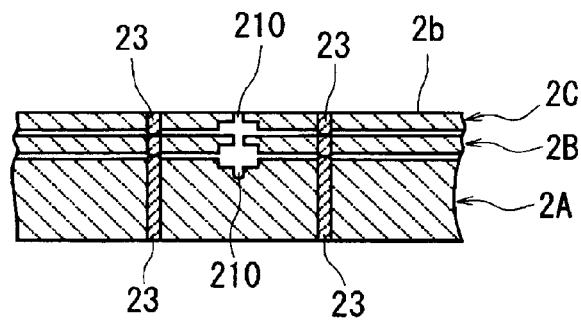
FIG. 4B is an enlarged sectional view showing an essential part of a stacked wafer obtained by the first back grinding step using the grinding apparatus shown in FIG. 4A.
Figure 4C:
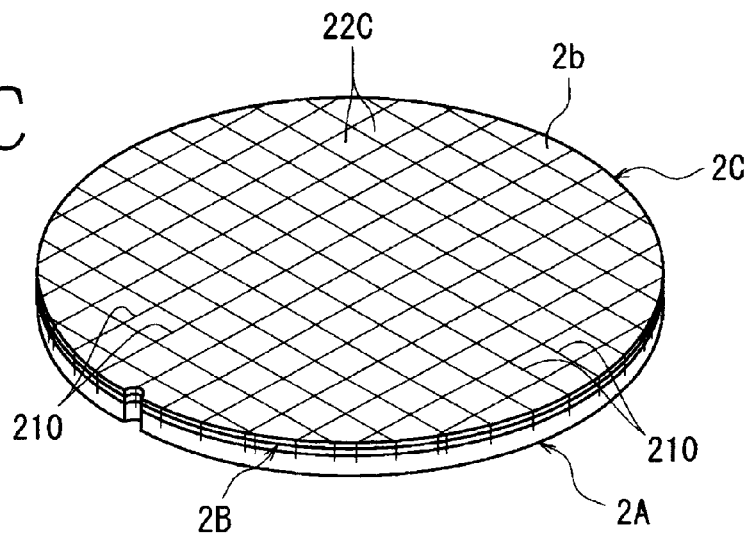
FIG. 4C is a perspective view showing the stacked wafer shown in FIG. 4B.

Thereafter, the chuck table 41 is rotated at 300 rpm, for example, in the direction shown by an arrow 41a in FIG. 4A, and the grinding wheel 42 of the grinding means 43 is rotated at 6000 rpm, for example, in the direction shown by an arrow 42a in FIG. 4A. At the same time, the grinding wheel 42 is lowered until it comes into contact with the back side 2b of the semiconductor wafer 2B, thereby grinding the back side 2b of the semiconductor wafer 2B until each kerf 210 formed on the front side 2a of the semiconductor wafer 2B is exposed to the back side 2b of the semiconductor wafer 2B as shown in FIG. 4B. Thus, the back side 2b of the semiconductor wafer 2B is ground until each kerf 210 of the semiconductor wafer 2B is exposed to the back side 2b of the semiconductor wafer 2B, thereby dividing the semiconductor wafer 2B into individual devices 22B as shown in FIG. 4C. However, the individual devices 22B are still bonded to the semiconductor wafer 2A as a base wafer, so that the form of the semiconductor wafer 2B is maintained without scattering of the individual devices 22B.

After performing the first back grinding step, a second stacking step is performed in the following manner. A third wafer subjected to the kerf forming step is stacked to the second wafer after performing the first back grinding step in such a manner that the front side of the third wafer is opposed to the back side of the second wafer and that the electrodes of the third wafer are respectively bonded to the electrodes of the second wafer. More specifically, as shown in FIGS. 5A to 5C, a semiconductor wafer 2C subjected to the kerf forming step is stacked to the semiconductor wafer 2B subjected to the first back grinding step in such a manner that the front side 2a of the semiconductor wafer 2C is opposed to the back side 2b of the semiconductor wafer 2B and that the electrodes 23 of the semiconductor wafer 2C are respectively bonded to the electrodes 23 of the semiconductor wafer 2B, thus forming a stacked wafer 20. As a modification, the front side 2a of the semiconductor wafer 2C may be bonded through an anisotropic conductive material 25 to the back side 2b of the semiconductor wafer 2B as shown in FIG. 5D. In this case, each kerf 210 of the semiconductor wafer 2C is filled with the anisotropic conductive adhesive 25.

Figure 6A:
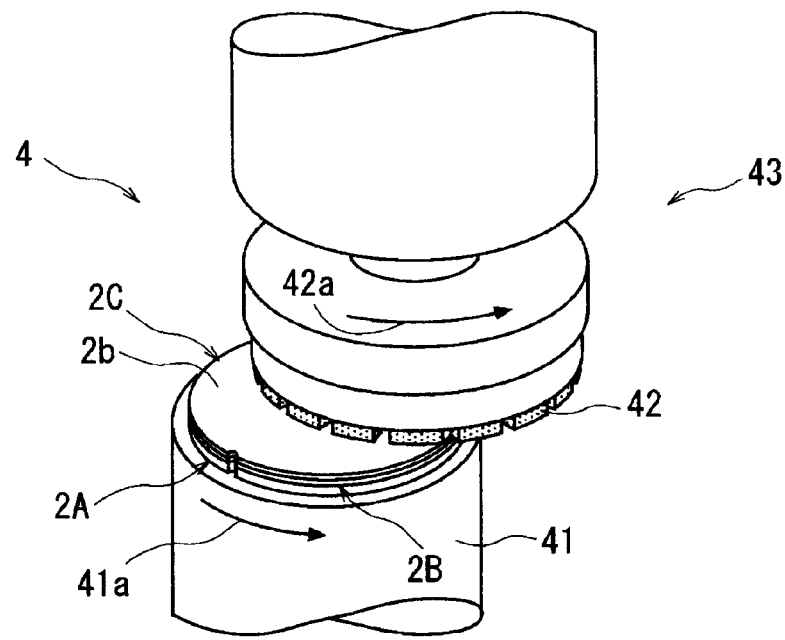
FIG. 6A is a perspective view showing a grinding apparatus for performing a second back grinding step in the first preferred embodiment of the stacked device manufacturing method according to the present invention.

After performing the second stacking step, a second back grinding step is performed in the following manner. The back side of the third wafer stacked to the second wafer by the second stacking step is ground to expose each kerf of the third wafer to the back side of the third wafer. The second back grinding step may be performed by using the grinding apparatus 4 shown in FIG. 4A. As shown in FIG. 6A, the laminate of the semiconductor wafers 2A, 2B, and 2C, i.e., the stacked wafer 20 is placed on the chuck table 41 in the condition where the back side 2b of the semiconductor wafer 2A as a base wafer comes into contact with the upper surface of the chuck table 41. By operating the suction means, the stacked wafer 20 is held on the chuck table 41 under suction. Accordingly, the back side 2b of the semiconductor wafer 2C of the stacked wafer 20 held on the chuck table 41 is oriented upward.

Figure 6B:
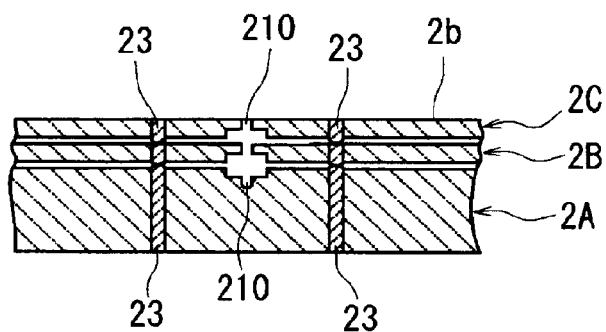
FIG. 6B is an enlarged sectional view showing a stacked wafer obtained by the second back grinding step using the grinding apparatus shown in FIG. 6A.
Figure 6C:
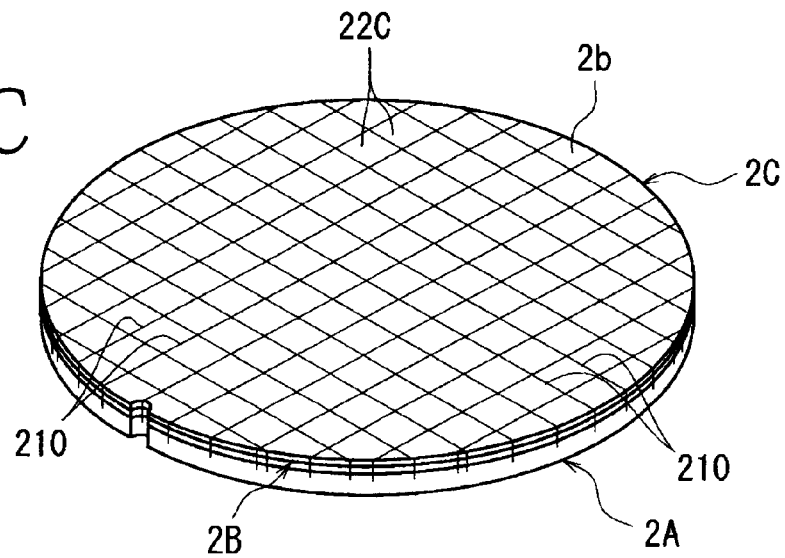
FIG. 6C is a perspective view showing the stacked wafer shown in FIG. 6B.

Thereafter, the chuck table 41 is rotated at 300 rpm, for example, in the direction shown by an arrow 41a in FIG. 6A, and the grinding wheel 42 of the grinding means 43 is rotated at 6000 rpm, for example, in the direction shown by an arrow 42a in FIG. 6A. At the same time, the grinding wheel 42 is lowered until it comes into contact with the back side 2b of the semiconductor wafer 2C, thereby grinding the back side 2b of the semiconductor wafer 2C until each kerf 210 formed on the front side 2a of the semiconductor wafer 2C is exposed to the back side 2b of the semiconductor wafer 2C as shown in FIG. 6B. Thus, the back side 2b of the semiconductor wafer 2C is ground until each kerf 210 of the semiconductor wafer 2C is exposed to the back side 2b of the semiconductor wafer 2C, thereby dividing the semiconductor wafer 2C into individual devices 22C as shown in FIG. 6C. However, the individual devices 22C are still bonded through the respective individual devices 22B of the semiconductor wafer 2B to the semiconductor wafer 2A as a base wafer, so that the form of the semiconductor wafer 2C is maintained without scattering of the individual devices 22C.

Figure 7:
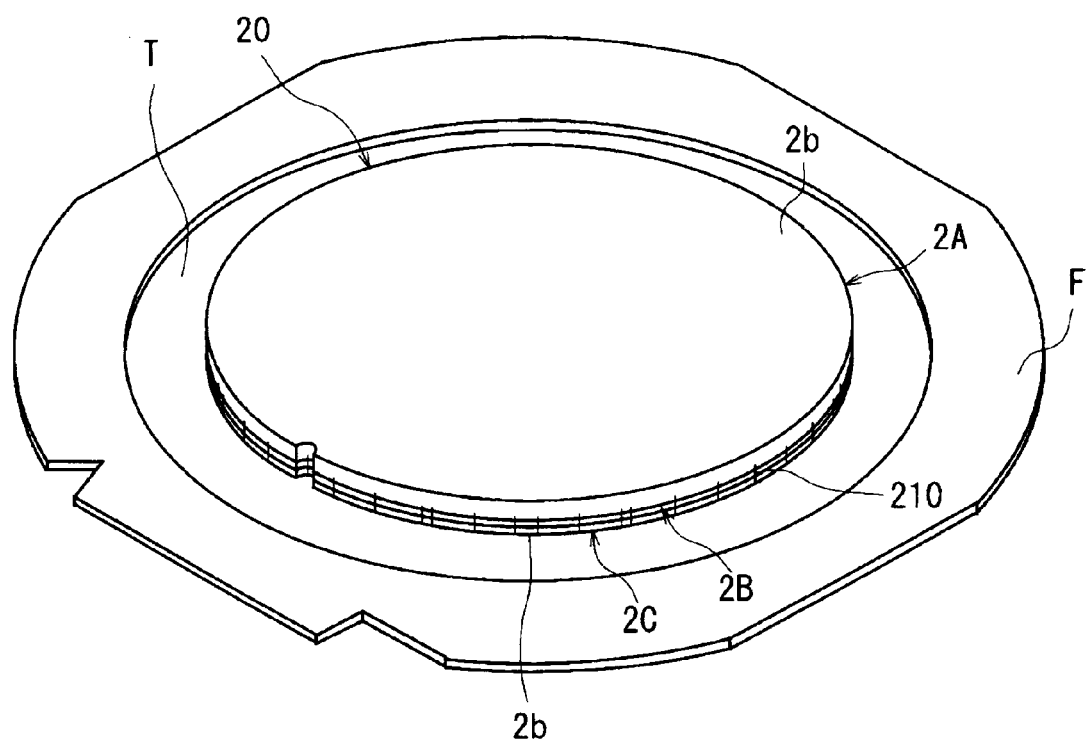
FIG. 7 is a perspective view showing a wafer supporting step in the first preferred embodiment of the stacked device manufacturing method according to the present invention.

After performing the second back grinding step, a wafer supporting step is performed in such a manner that the back side 2b of the semiconductor wafer 2C of the stacked wafer 20 is attached to the front side of a dicing tape T supported to an annular frame F as shown in FIG. 7. Accordingly, the back side 2b of the semiconductor wafer 2A as a base wafer of the stacked wafer 20 attached to the front side (upper surface) of the dicing tape T is oriented upward.

Figure 8A:
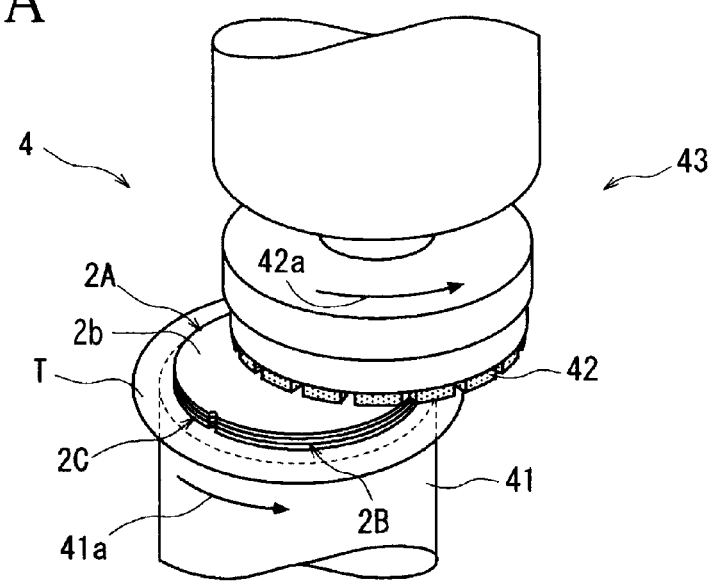
FIG. 8A is a perspective view showing a grinding apparatus for performing a third back grinding step in the first preferred embodiment of the stacked device manufacturing method according to the present invention.

Next, a third back grinding step is performed in the following manner. The back side of the first wafer as a base wafer of the stacked wafer 20 attached to the front side of the dicing tape T is ground to expose each kerf of the first wafer to the back side of the first wafer. The third back grinding step may be performed by using the grinding apparatus 4 shown in FIG. 4A. As shown in FIG. 8A, the dicing tape T to which the stacked wafer 20 is attached is placed on the chuck table 41. By operating the suction means, the stacked wafer 20 is held through the dicing tape T on the chuck table 41 under suction. Accordingly, the back side 2b of the semiconductor wafer 2A as a base wafer of the stacked wafer 20 held under suction on the chuck table 41 through the dicing tape T is oriented upward. Although the annular frame F supporting the dicing tape T is not shown in FIG. 8A, the annular frame F is actually fixed by any suitable clamps provided on the chuck table 41.

Figure 8B:
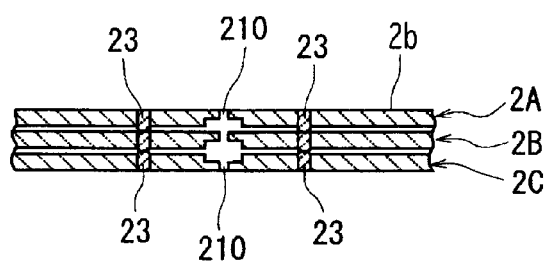
FIG. 8B is an enlarged sectional view showing an essential part of a stacked wafer obtained by the third back grinding step using the grinding apparatus shown in FIG. 8A.
Figure 8C:
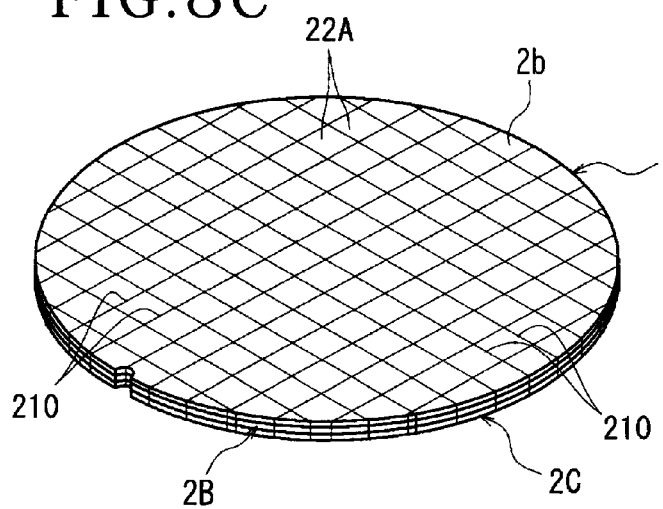
FIG. 8C is a perspective view showing the stacked wafer shown in FIG. 8B.
Figure 8D:
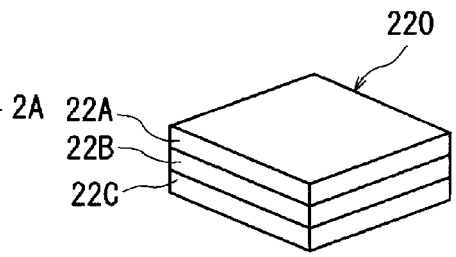
FIG. 8D is a perspective view showing a stacked device obtained from the stacked wafer shown in FIG. 8C.

Thereafter, the chuck table 41 is rotated at 300 rpm, for example, in the direction shown by an arrow 41a in FIG. 8A, and the grinding wheel 42 of the grinding means 43 is rotated at 6000 rpm, for example, in the direction shown by an arrow 42a in FIG. 8A. At the same time, the grinding wheel 42 is lowered until it comes into contact with the back side 2b of the semiconductor wafer 2A, thereby grinding the back side 2b of the semiconductor wafer 2A as a base wafer until each kerf 210 formed on the front side 2a of the semiconductor wafer 2A is exposed to the back side 2b of the semiconductor wafer 2A as shown in FIG. 8B. Thus, the back side 2b of the semiconductor wafer 2A as a base wafer is ground until each kerf 210 of the semiconductor wafer 2A is exposed to the back side 2b of the semiconductor wafer 2A, thereby dividing the semiconductor wafer 2A into individual devices 22A as shown in FIG. 8C. At this time, each of the semiconductor wafers 2B and 2C is already divided into individual devices 22B and 22C, respectively, so that, by the semiconductor wafer 2A being divided into individual devices 22A, the individual devices 22A, 22B and 22C are stacked to form a stacked device 220 as shown in FIG. 8D.

As described above, the stacked device 220 is manufactured by stacking the semiconductor wafers 2 and next grinding the back side 2b of each semiconductor wafer 2, so that the lamination of the semiconductor wafers 2 can be easily performed and the thickness of each semiconductor wafer 2 can be reduced. Accordingly, the thickness of the stacked device 220 can be minimized. By repeating the second stacking step and the second back grinding step, the number of layers of the stacked device 220 can be increased.

Figure 9:
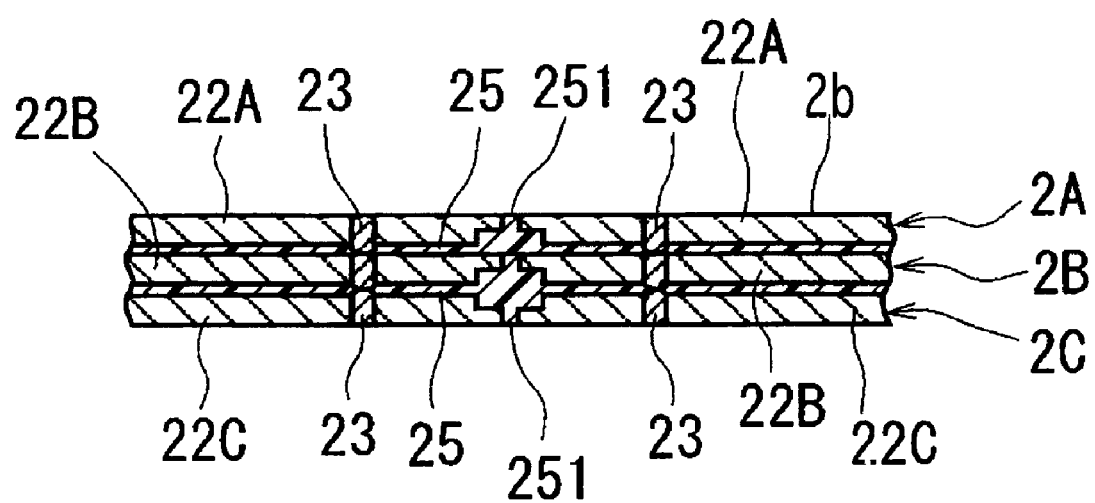
FIG. 9 is an enlarged sectional view showing an essential part of a stacked wafer similar to that shown in FIG. 8B as obtained by using an adhesive.

In the case that the front side 2a of the semiconductor wafer 2A as a base wafer and the front side 2a of the semiconductor wafer 2B are bonded to each other through the anisotropic conductive adhesive 25 in the first stacking step and that the back side 2b of the semiconductor wafer 2B and the front side 2a of the semiconductor wafer 2C are bonded to each other through the anisotropic conductive adhesive 25 in the second stacking step, the adjacent devices 22A of the semiconductor wafer 2A are bonded to each other through an anisotropic conductive adhesive 251 filled in each kerf 210 of the semiconductor wafer 2A as a base wafer as shown in FIG. 9 in the condition after the third back grinding step. Similarly, the adjacent devices 22B of the semiconductor wafer 2B are bonded to each other through an anisotropic conductive adhesive 251 filled in each kerf 210 of the semiconductor wafer 2B as shown in FIG. 9, and the adjacent devices 22C of the semiconductor wafer 2C are bonded to each other through an anisotropic conductive adhesive 251 filled in each kerf 210 of the semiconductor wafer 2C. Accordingly, the anisotropic conductive adhesive 251 bonding the adjacent devices 22A, 22B, and 22C must be separated to obtain the individual stacked devices 220. Consequently, an adhesive separating step is performed to separate the anisotropic conductive adhesive 251 bonding the adjacent devices of each semiconductor wafer.

Figure 10:
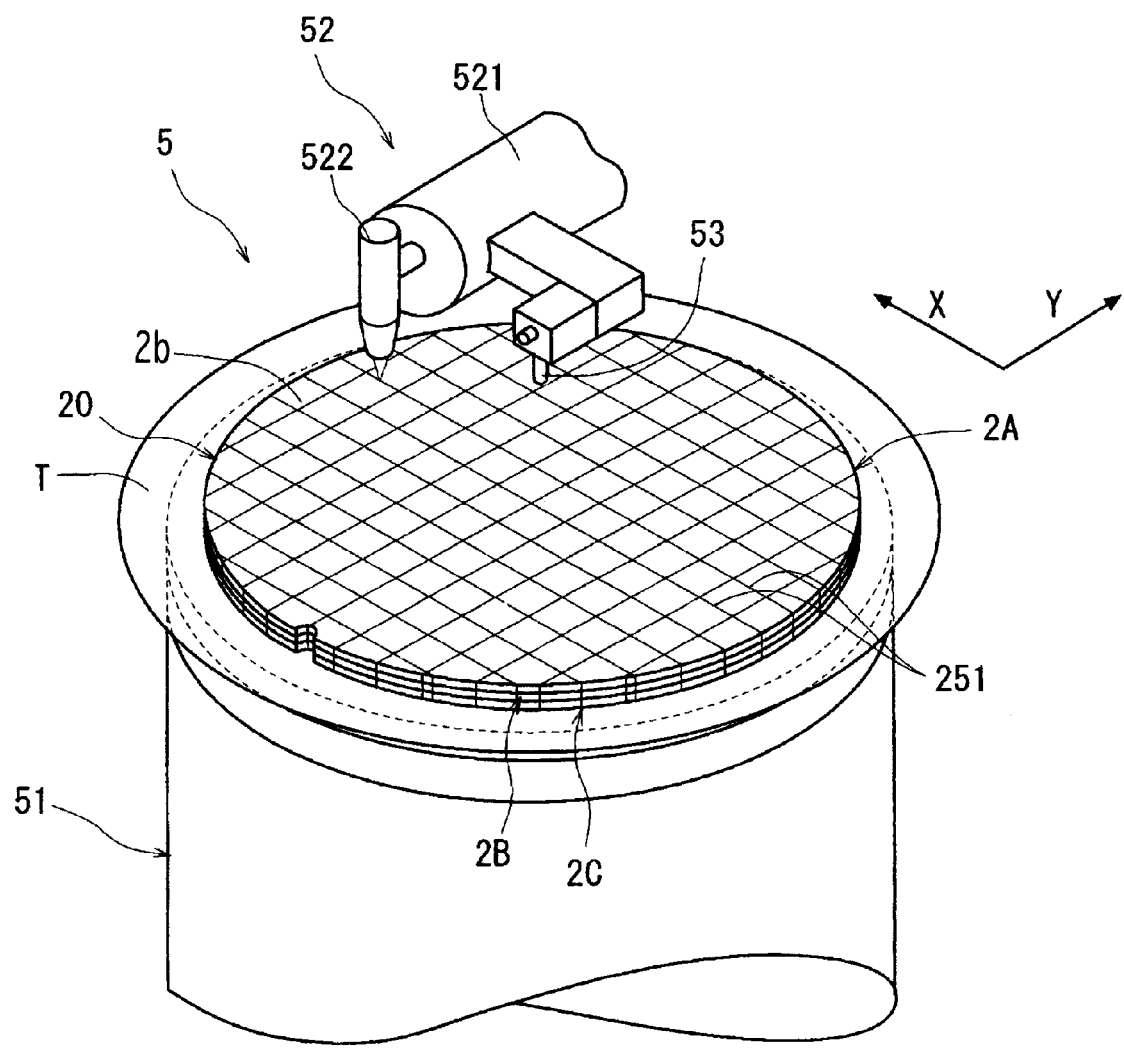
FIG. 10 is a perspective view showing a laser processing apparatus for performing an adhesive separating step in the first preferred embodiment of the stacked device manufacturing method according to the present invention.

A first preferred embodiment of the adhesive separating step will now be described with reference to FIGS. 10 to 12. The first preferred embodiment of the adhesive separating step is performed by using a laser processing apparatus 5 shown in FIG. 10. The laser processing apparatus 5 shown in FIG. 10 includes a chuck table 51 for holding a workpiece, laser beam applying means 52 for applying a laser beam to the workpiece held on the chuck table 51, and imaging means 53 for imaging the workpiece held on the chuck table 51. The chuck table 51 is so configured as to hold the workpiece under suction. The chuck table 51 is movable both in a feeding direction shown by an arrow X in FIG. 10 and in an indexing direction shown by an arrow Y in FIG. 10 by means of a moving mechanism (not shown).

The laser beam applying means 52 includes a cylindrical casing 521 extending in a substantially horizontal direction. Although not shown, the casing 521 contains pulsed laser beam oscillating means including a pulsed laser beam oscillator and repetition frequency setting means. Examples of the pulsed laser beam oscillator include a YAG laser oscillator and a YVO4 laser oscillator. The laser beam applying means 52 further includes a focusing device 522 mounted on the front end of the casing 521 for focusing the pulsed laser beam oscillated from the pulsed laser beam oscillating means. The imaging means 53 is mounted on the front end portion of the casing 521 of the laser beam applying means 52. In the embodiment shown in FIG. 10, the imaging means 53 includes an imaging device (CCD), and an image signal output from the imaging means 53 is transmitted to control means (not shown).

The adhesive separating step using the laser processing apparatus 5 is performed in the following manner. The dicing tape T to which the stacked wafer 20 subjected to the third back grinding step is attached is placed on the chuck table 51. By operating suction means (not shown), the stacked wafer 20 is held through the dicing tape T on the chuck table 51. Accordingly, the back side 2b of the semiconductor wafer 2A as a base wafer of the stacked wafer 20 held on the chuck table 51 through the dicing tape T under suction is oriented upward. Although the annular frame F supporting the dicing tape T is not shown in FIG. 10, the annular frame F is actually held to the chuck table 51 by any suitable frame holding means provided on the chuck table 51. Thereafter, the chuck table 51 thus holding the stacked wafer 20 is moved to a position directly below the imaging means 53 by the moving mechanism.

When the chuck table 51 is positioned directly below the imaging means 53, an alignment operation is performed by the control means not shown and the imaging means 53 to detect a processing area of the stacked wafer 20 to be laser-processed. More specifically, the control means not shown and the imaging means 53 perform image processing such as pattern matching for making the alignment between the anisotropic conductive adhesive 251 filled in each kerf 210 extending in a predetermined direction on the stacked wafer 20 and the focusing device 522 of the laser beam applying means 52 for applying the laser beam along the anisotropic conductive adhesive 251, thus performing the alignment of a laser beam applying position (alignment step). Similarly, the alignment operation is performed for the anisotropic conductive adhesive 251 filled in each kerf 210 extending in a direction perpendicular to the direction mentioned above on the stacked wafer 20.

Figure 11A:
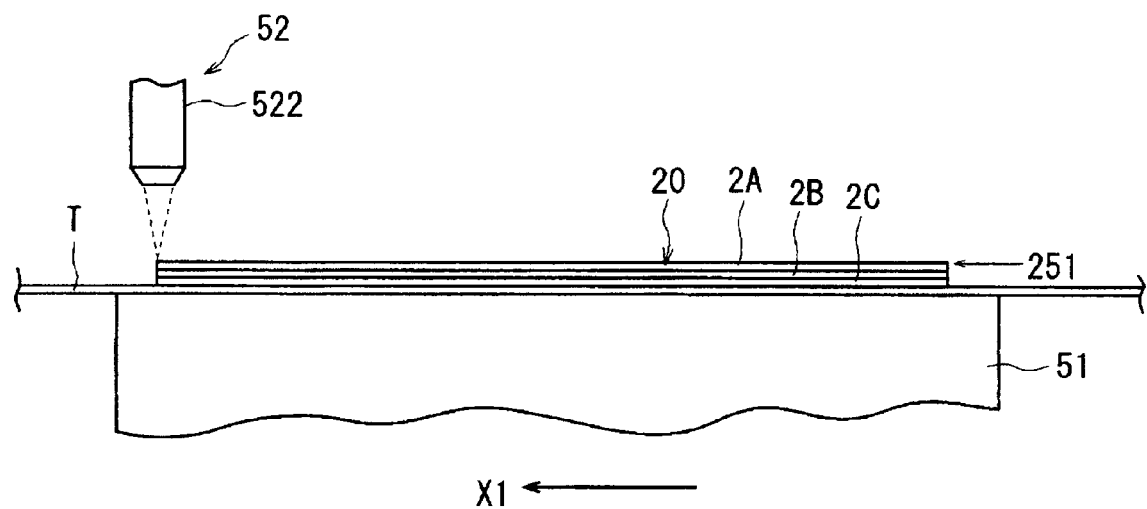
FIG. 11A is a side view showing the adhesive separating step using the laser processing apparatus shown in FIG. 10.
Figure 12:
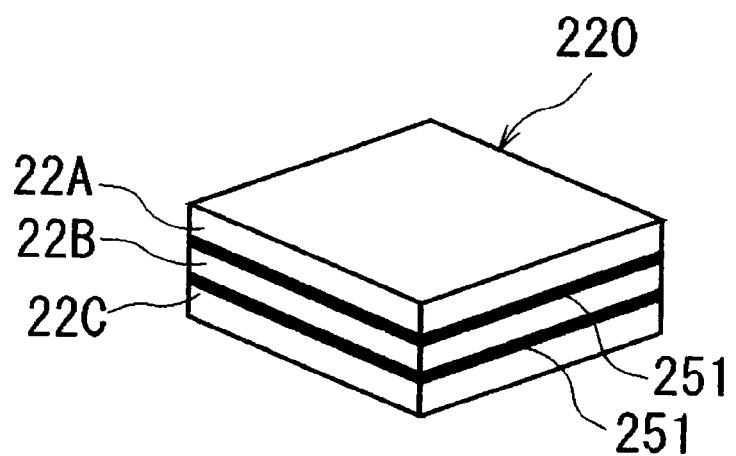
FIG. 12 is a perspective view showing a stacked device obtained from the stacked wafer shown in FIG. 11B.

After performing the alignment of the laser beam applying position by detecting the anisotropic conductive adhesives 251 filled in all of the kerfs 210 of the stacked wafer 20 as described above, the chuck table 51 is moved to a laser beam applying area where the focusing device 522 of the laser beam applying means 52 is located as shown in FIG. 11A, thereby positioning one end (left end as viewed in FIG. 11A) of the anisotropic conductive adhesive 251 filled in a predetermined one of the kerfs 210, directly below the focusing device 522 of the laser beam applying means 52. In this condition, a pulsed laser beam having an absorption wavelength (355 nm) to the anisotropic conductive adhesive 251 is applied from the focusing device 522, and the chuck table 51 is moved in the direction shown by an arrow X1 in FIG. 11A at a predetermined feed speed.

Figure 11B:
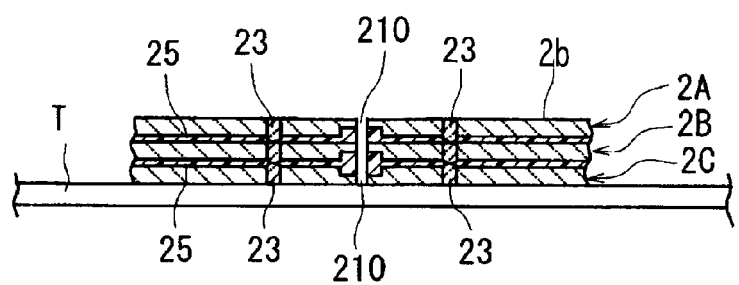
FIG. 11B is an enlarged sectional view showing an essential part of a stacked wafer obtained by the adhesive separating step shown in FIG. 11A.

When the laser beam applying position of the focusing device 522 of the laser beam applying means 52 reaches the other end (right end as viewed in FIG. 11A) of the anisotropic conductive adhesive 251 filled in the predetermined kerf 210, the application of the pulsed laser beam from the focusing device 522 is stopped and the movement of the chuck table 51 is also stopped. As a result, the anisotropic conductive adhesive 251 filled in the predetermined kerf 210 is cut to be separated as shown in FIG. 11B (adhesive separating step). This adhesive separating step is performed along the anisotropic conductive adhesives 251 filled in all of the kerfs 210 of the stacked wafer 20 to thereby obtain a stacked device 220 composed of the devices 22A, 22B, and 22C bonded together through the anisotropic conductive adhesive layers 251 as shown in FIG. 12.

Figure 13:
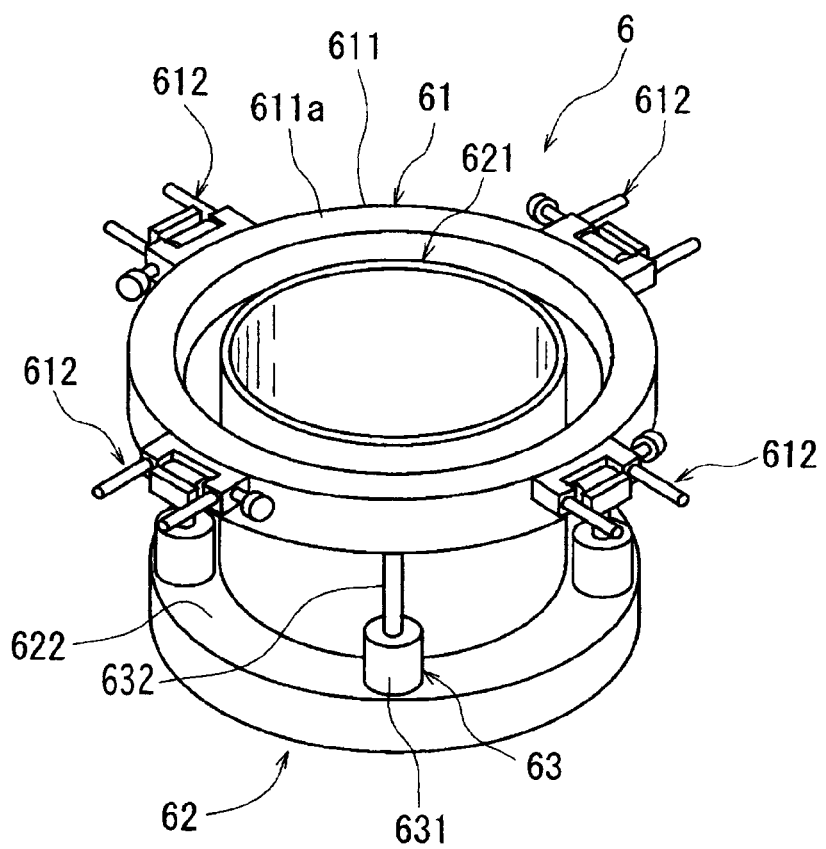
FIG. 13 is a perspective view showing a tape expanding apparatus for performing a modification of the adhesive separating step in the first preferred embodiment of the stacked device manufacturing method according to the present invention.

A second preferred embodiment of the adhesive separating step will now be described with reference to FIGS. 13 to 14B. The second preferred embodiment of the adhesive separating step is performed by using a tape expanding apparatus 6 shown in FIG. 13. The tape expanding apparatus 6 shown in FIG. 13 includes frame holding means 61 for holding the annular frame F and tape expanding means 62 for expanding the dicing tape T supported to the annular frame F held by the frame holding means 61. The frame holding means 61 includes an annular frame holding member 611 and a plurality of clamps 612 as fixing means provided on the outer circumference of the frame holding member 611. The upper surface of the frame holding member 611 functions as a mounting surface 611a for mounting the annular frame F thereon. The annular frame F mounted on the mounting surface 611a is fixed to the frame holding member 611 by the clamps 612. The thus configured frame holding means 61 is supported to the tape expanding means 62 so as to be vertically movable.

Figure 14A:
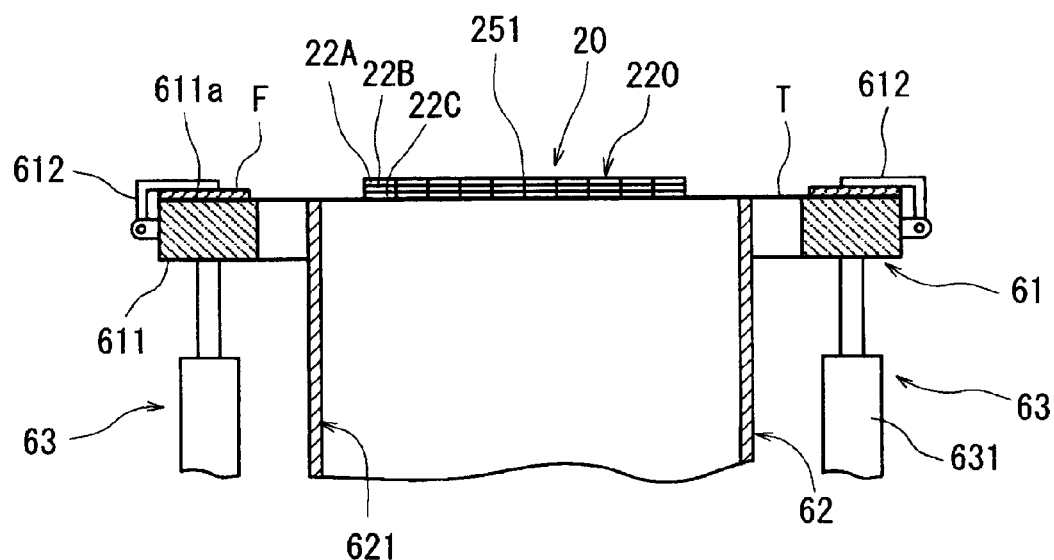
FIGS. 14A and 14B are sectional views showing the adhesive separating step using the tape expanding apparatus shown in FIG. 13.

The tape expanding means 62 includes an expanding drum 621 provided inside of the annular frame holding member 611. The expanding drum 621 has an outer diameter smaller than the inner diameter of the annular frame F and an inner diameter larger than the outer diameter of the stacked wafer 20 attached to the dicing tape T supported to the annular frame F. The expanding drum 621 has a supporting flange 622 at the lower end thereof. The tape expanding means 62 of the embodiment shown in FIG. 13 further includes supporting means 63 for vertically moving the annular frame holding member 611. The supporting means 63 is composed of a plurality of air cylinders 631 provided on the supporting flange 622. Each air cylinder 631 is provided with a piston rod 632 connected to the lower surface of the annular frame holding member 611. The supporting means 63 composed of the plural air cylinders 631 functions to vertically move the annular frame holding member 611 so as to selectively take a reference position where the mounting surface 611a is substantially equal in height to the upper end of the expanding drum 621 as shown in FIG. 14A and an expansion position where the mounting surface 611a is lower in height than the upper end of the expanding drum 621 by a predetermined amount as shown in FIG. 14B. Accordingly, the supporting means 63 composed of the plural air cylinders 631 functions as expanding moving means for relatively moving the expanding drum 621 and the frame holding member 611 in the vertical direction.

The adhesive separating step using the tape expanding apparatus 6 configured as described above will now be described with reference to FIGS. 14A and 14B. As shown in FIG. 14A, the annular frame F supporting the stacked wafer 20 through the dicing tape T is mounted on the mounting surface 611a of the frame holding member 611 of the frame holding means 61 and fixed to the frame holding member 611 by the clamps 612. At this time, the frame holding member 611 is set at the reference position shown in FIG. 14A. Thereafter, the air cylinders 631 as the supporting means 63 of the tape expanding means 62 are operated to lower the frame holding member 611 to the expansion position shown in FIG. 14B.

Figure 14B:
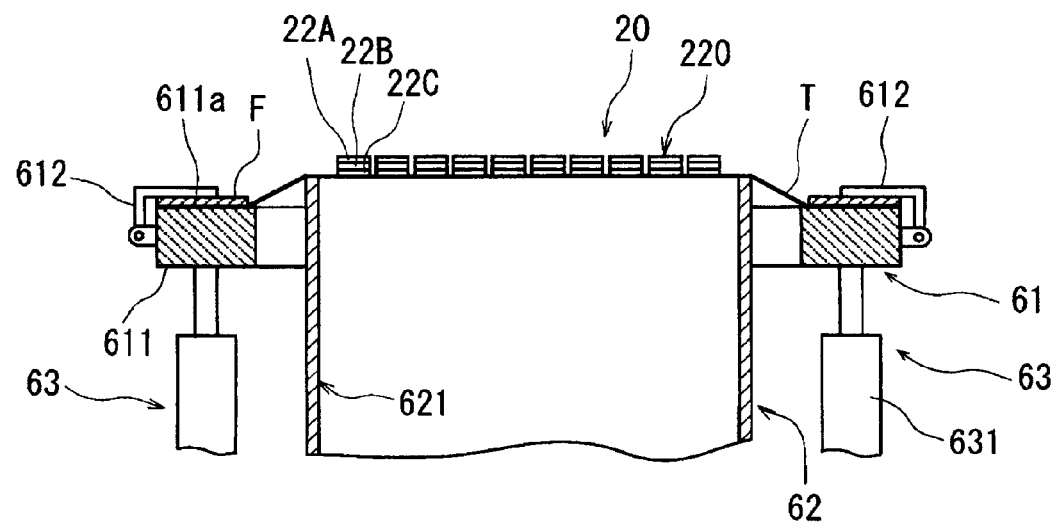

Accordingly, the annular frame F fixed to the mounting surface 611a of the frame holding member 611 is also lowered, so that the dicing tape T supported to the annular frame F comes into abutment against the upper end of the expanding drum 621 and is expanded substantially in the radial direction of the expanding drum 621 as shown in FIG. 14B. As a result, a tensile force is radially applied to the stacked wafer 20 attached to the dicing tape T, and the anisotropic conductive adhesive 251 filled in each kerf 210 of the stacked wafer 20 is therefore broken to be separated as shown in FIG. 14B, thereby obtaining the stacked device 220 composed of the devices 22A, 22B, and 22C bonded together through the anisotropic conductive adhesive layers 251 as shown in FIG. 12.

Figure 15:
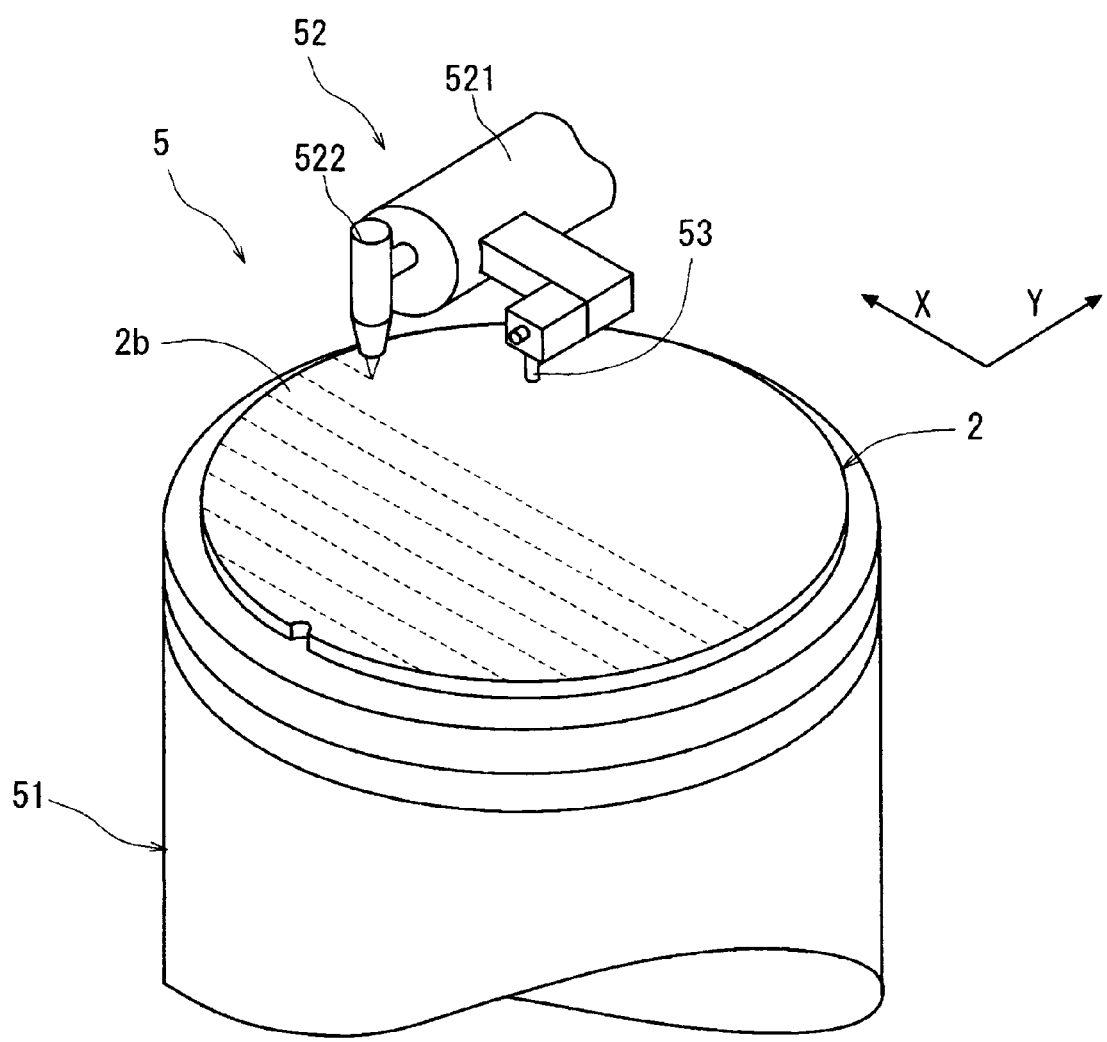
FIG. 15 is a perspective view showing a laser processing apparatus for performing a modified layer forming step in a second preferred embodiment of the stacked device manufacturing method according to the present invention.

A second preferred embodiment of the stacked device manufacturing method according to the present invention will now be described with reference to FIGS. 15 to 23B. The second preferred embodiment of the stacked device manufacturing method includes a modified layer forming step of applying a laser beam to a wafer along each street to thereby form a modified layer in the wafer along each street so that the modified layer is exposed to the front side of the wafer. This modified layer forming step in the second preferred embodiment is performed instead of the kerf forming step in the first preferred embodiment. This modified layer forming step is performed by using a laser processing apparatus 5 shown in FIG. 15 similar to that shown in FIG. 10. The modified layer forming step using the laser processing apparatus 5 shown in FIG. 15 is performed in the following manner. The semiconductor wafer 2 is placed on the chuck table 51 in the condition where the back side 2b of the semiconductor wafer 2 is oriented upward. Thereafter, the suction means is operated to hold the semiconductor wafer 2 on the chuck table 51 under suction. Thereafter, the chuck table 51 thus holding the semiconductor wafer 2 is moved to a position directly below the imaging means 53 by the moving mechanism.

When the chuck table 51 is positioned directly below the imaging means 53, an alignment operation is performed by the imaging means 53 and the control means (not shown) to detect a processing area of the semiconductor wafer 2 to be laser-processed. More specifically, the imaging means 53 and the control means perform image processing such as pattern matching for making the alignment between each street 21 extending in a predetermined direction of the semiconductor wafer 2 and the focusing device 522 of the laser beam applying means 52 for applying the laser beam along each street 21, thus performing the alignment of a laser beam applying position. Similarly, the alignment operation of the laser beam applying position is performed for each street 21 extending in a direction perpendicular to the predetermined direction mentioned above on the semiconductor wafer 2. The front side 2a of the semiconductor wafer 2 on which the streets 21 are formed is oriented downward. However, the streets 21 can be imaged from the back side 2b of the semiconductor wafer 2 because the imaging means 53 includes infrared light applying means, an optical system for capturing infrared light, and an imaging device (infrared CCD) for outputting an electrical signal corresponding to the infrared light captured by the optical system.

Figure 16A:
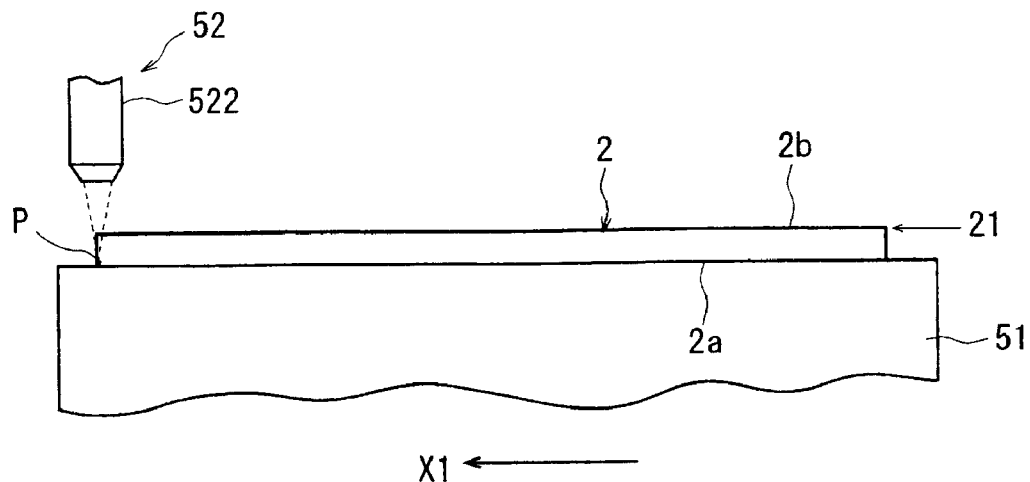
FIGS. 16A and 16B are side views showing the modified layer forming step using the laser processing apparatus shown in FIG. 15.

After performing this alignment step to detect all of the streets 21 formed on the front side 2a of the semiconductor wafer 2 held on the chuck table 51, the chuck table 51 is moved to a laser beam applying area where the focusing device 522 of the laser beam applying means 52 is located as shown in FIG. 16A, thereby positioning one end (left end as viewed in FIG. 16A) of a predetermined one of the streets 21 directly below the focusing device 522 of the laser beam applying means 52. In this condition, a pulsed laser beam having a transmission wavelength (1064 nm) to the semiconductor wafer 2 is applied from the focusing device 522, and the chuck table 51 is moved in the direction shown by an arrow X1 in FIG. 16A at a predetermined feed speed. When the laser beam applying position of the focusing device 522 of the laser beam applying means 52 reaches the other end (right end as viewed in FIG. 16B) of the predetermined street 21, the application of the pulsed laser beam from the focusing device 522 is stopped and the movement of the chuck table 51 is also stopped.

Figure 16B:
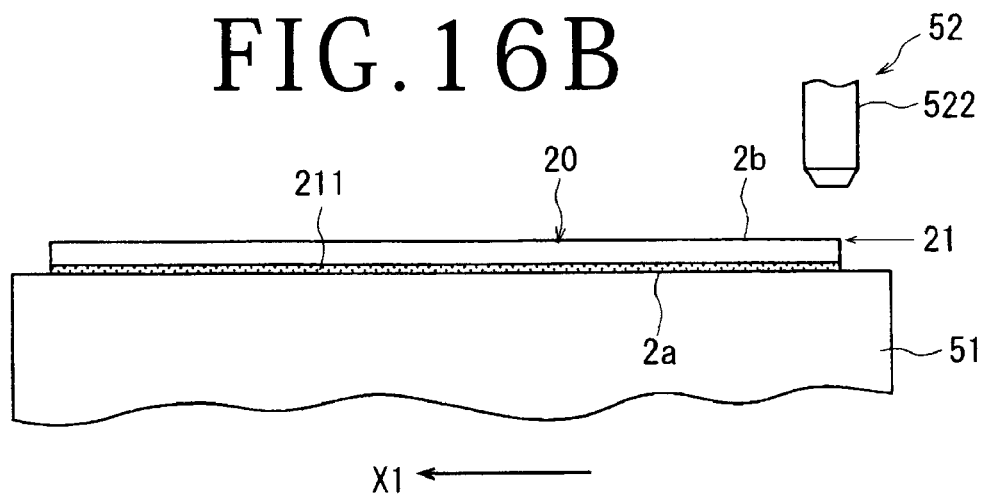
Figure 16C:
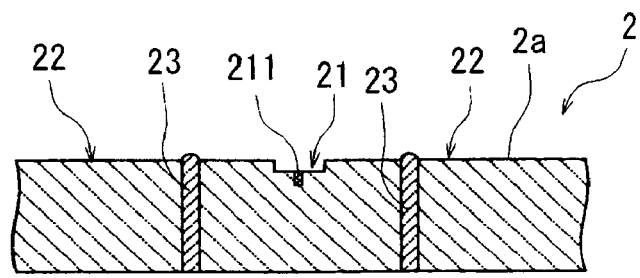
FIG. 16C is an enlarged sectional view showing an essential part of a semiconductor wafer obtained by the modified layer forming step shown in FIGS. 16A and 16B.

As shown in FIG. 16A, the focal point P of the pulsed laser beam to be applied from the focusing device 522 in this modified layer forming step is set near the front side 2a (lower surface as viewed in FIG. 16A) of the semiconductor wafer 2. As a result, a modified layer 211 is formed in the semiconductor wafer 2 along the predetermined street 21 so as to be exposed to the front side 2a (lower surface) of the semiconductor wafer 2 as shown in FIGS. 16B and 16C. This modified layer 211 is formed as a melt rehardened layer. This modified layer forming step is performed along all of the streets 21 formed on the front side 2a of the semiconductor wafer 2.

Figure 17A:
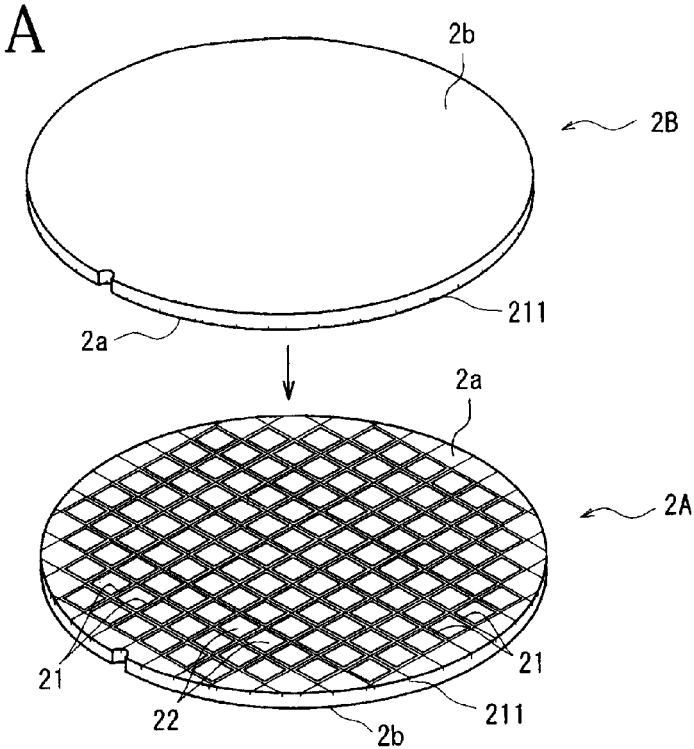
FIG. 17A is a perspective view showing a first stacking step in the second preferred embodiment of the stacked device manufacturing method according to the present invention.
Figure 17B:
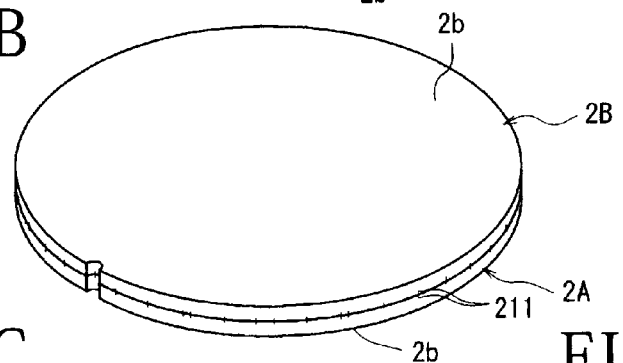
FIG. 17B is a perspective view showing a stacked wafer obtained by the first stacking step shown in FIG. 17A.
Figure 17C:
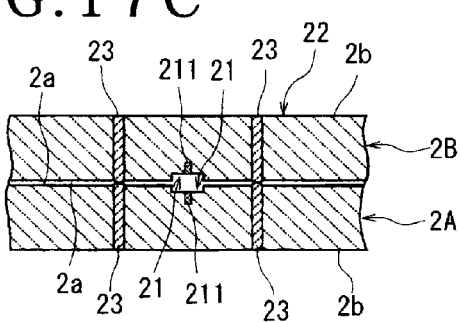
FIG. 17C is an enlarged sectional view showing an essential part of the stacked wafer shown in FIG. 17B.
Figure 17D:
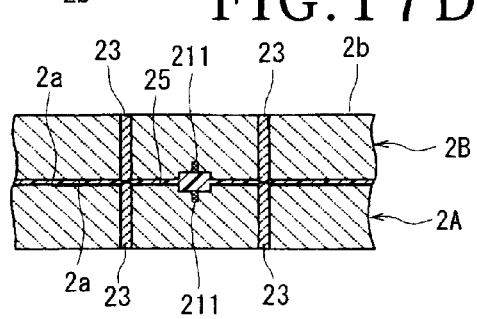
FIG. 17D is a view similar to FIG. 17C, showing a modification of the first stacking step shown in FIG. 17A.

After performing the modified layer forming step for a plurality of semiconductor wafers 2, a first stacking step is performed in the following manner. A first wafer as a base wafer subjected to the modified layer forming step and a second wafer subjected to the modified layer forming step are stacked together in such a manner that the front side of the second wafer is opposed to the front side of the first wafer and that the electrodes of the second wafer are respectively bonded to the electrodes of the first wafer. This first stacking step is similar to the first stacking step in the first preferred embodiment. That is, as shown in FIGS. 17A to 17C, a semiconductor wafer 2B subjected to the modified layer forming step is stacked to a semiconductor wafer 2A as a base wafer subjected to the modified layer forming step in such a manner that the front side 2a of the semiconductor wafer 2B is opposed to the front side 2a of the semiconductor wafer 2A and that the electrodes 23 of the semiconductor wafer 2B are respectively bonded to the electrodes 23 of the semiconductor wafer 2A. As a modification, the front side 2a of the semiconductor wafer 2B may be bonded through an anisotropic conductive adhesive 25 to the front side 2a of the semiconductor wafer 2A as a base wafer in the first stacking step as shown in FIG. 17D.

Figure 18A:
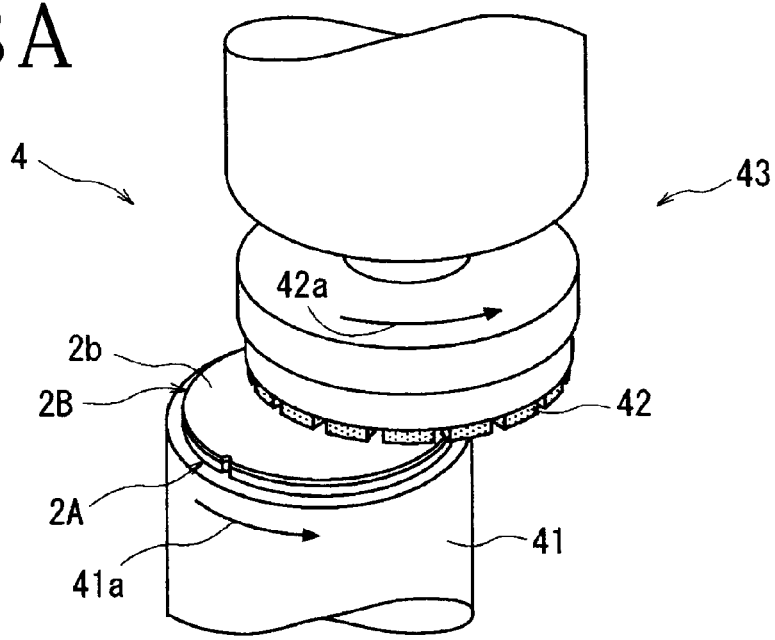
FIG. 18A is a perspective view showing a grinding apparatus for performing a first back grinding step in the second preferred embodiment of the stacked device manufacturing method according to the present invention.
Figure 18B:
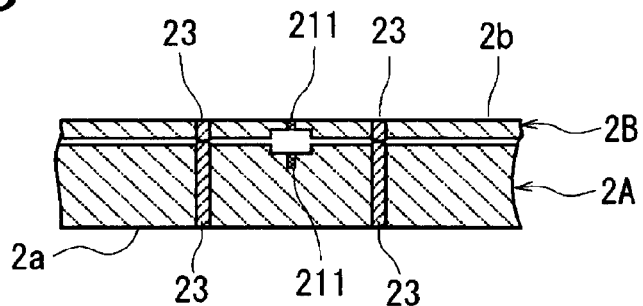
FIG. 18B is an enlarged sectional view showing an essential part of a stacked wafer obtained by the first back grinding step using the grinding apparatus shown in FIG. 18A.
Figure 18C:
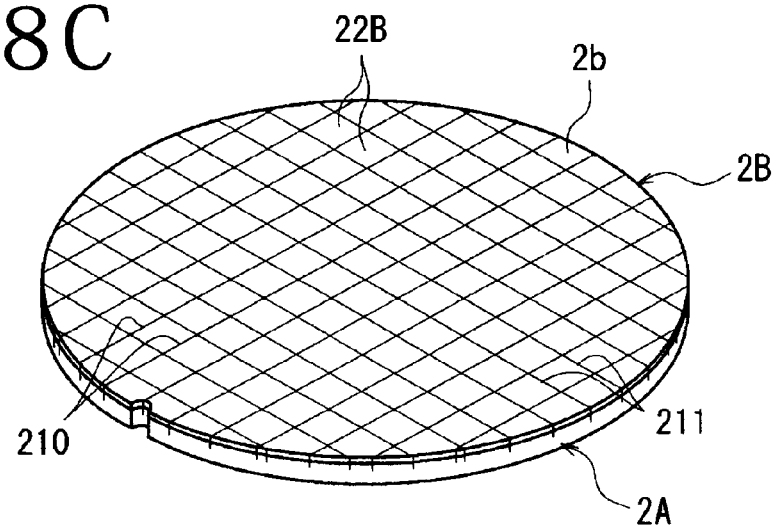
FIG. 18C is a perspective view showing the stacked wafer shown in FIG. 18B.

After performing the first stacking step, a first back grinding step is performed in the following manner. The back side of the second wafer stacked to the first wafer by the first stacking step is ground to reduce the thickness of the second wafer to a predetermined finished thickness. This first back grinding step is similar to the first back grinding step in the first preferred embodiment. Accordingly, as shown in FIGS. 18A to 18C, the back side 2b of the semiconductor wafer 2B is ground to reduce the thickness of the semiconductor wafer 2B to a predetermined finished thickness, so that the modified layer 211 formed along each street 21 of the semiconductor wafer 2B is exposed to the back side 2b of the semiconductor wafer 2B.

Figure 19A:
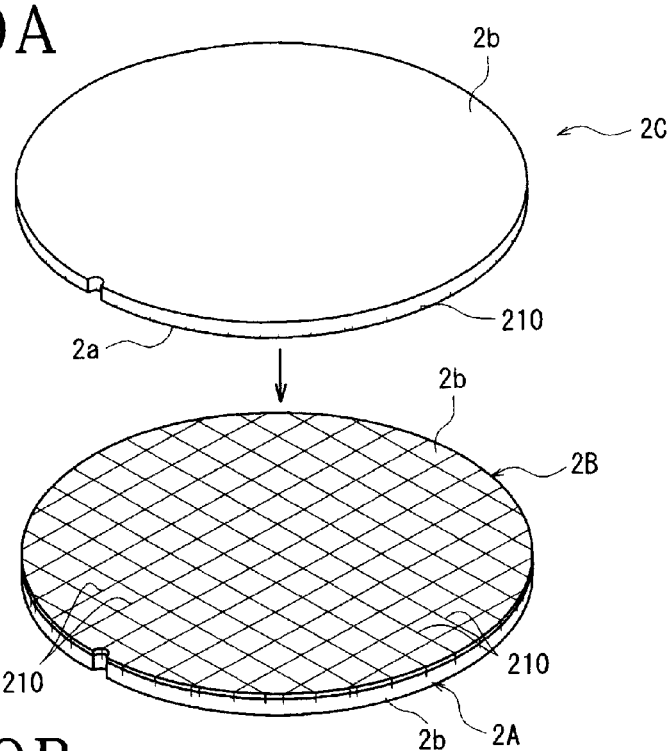
FIG. 19A is a perspective view showing a second stacking step in the second preferred embodiment of the stacked device manufacturing method according to the present invention.
Figure 19B:
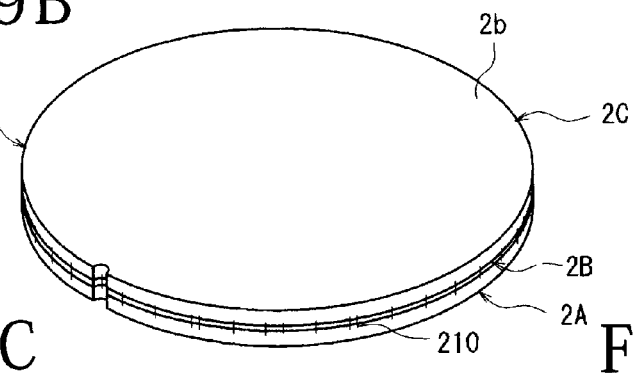
FIG. 19B is a perspective view showing a stacked wafer obtained by the second stacking step shown in FIG. 19A.
Figure 19C:
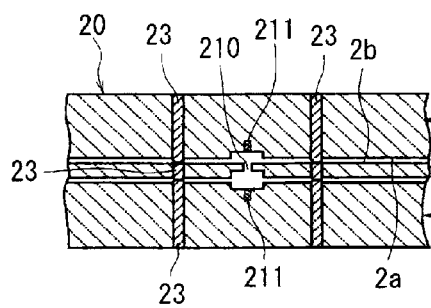
FIG. 19C is an enlarged sectional view showing the stacked wafer shown in FIG. 19B.
Figure 19D:
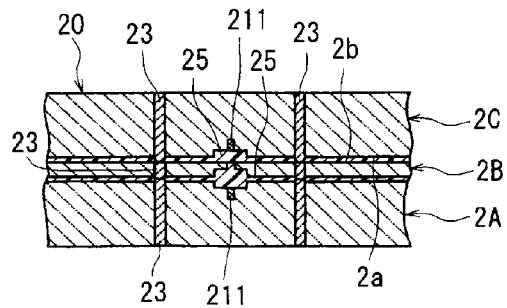
FIG. 19D is a view similar to FIG. 19C, showing a modification of the second stacking step shown in FIG. 19A.

After performing the first back grinding step, a second stacking step is performed in the following manner. A third wafer subjected to the modified layer forming step is stacked to the second wafer after performing the first back grinding step in such a manner that the front side of the third wafer is opposed to the back side of the second wafer and that the electrodes of the third wafer are respectively bonded to the electrodes of the second wafer. This second stacking step is similar to the second stacking step in the first preferred embodiment. That is, as shown in FIGS. 19A to 19C, a semiconductor wafer 2C subjected to the modified layer forming step is stacked to the semiconductor wafer 2B subjected to the first back grinding step in such a manner that the front side 2a of the semiconductor wafer 2C is opposed to the back side 2b of the semiconductor wafer 2B and that the electrodes 23 of the semiconductor wafer 2C are respectively bonded to the electrodes 23 of the semiconductor wafer 2B, thus forming a stacked wafer 20. As a modification, the front side 2a of the semiconductor wafer 2C may be bonded through an anisotropic conductive adhesive 25 to the back side 2b of the semiconductor wafer 2B as shown in FIG. 19D.

Figure 20A:
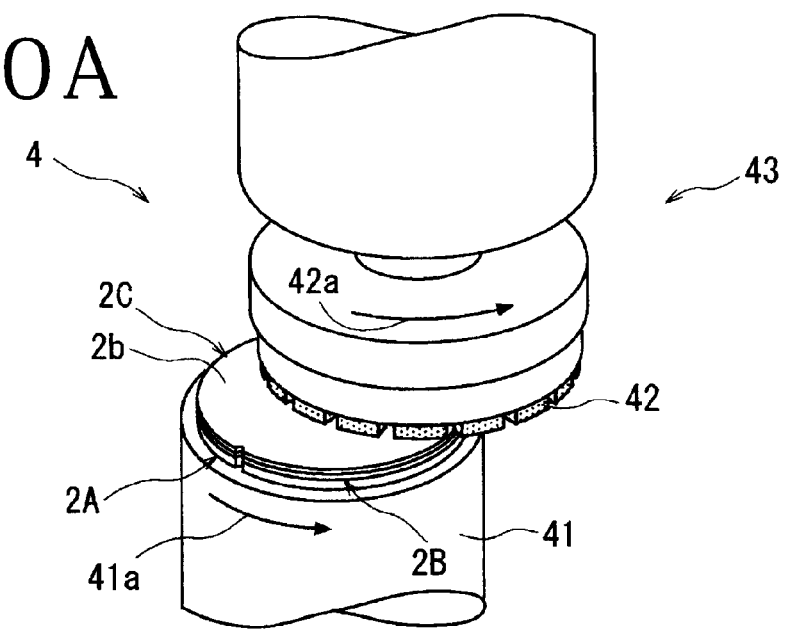
FIG. 20A is a perspective view showing a grinding apparatus for performing a second back grinding step in the second preferred embodiment of the stacked device manufacturing method according to the present invention.
Figure 20B:
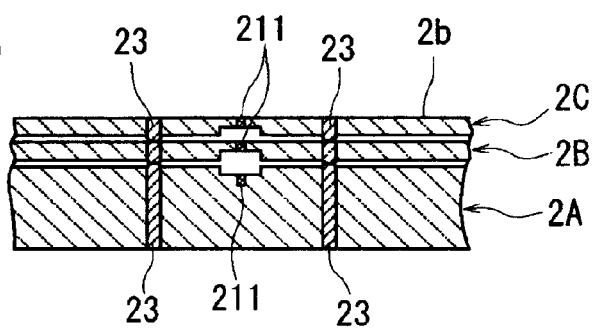
FIG. 20B is an enlarged sectional view showing a stacked wafer obtained by the second back grinding step using the grinding apparatus shown in FIG. 20A.
Figure 20C:
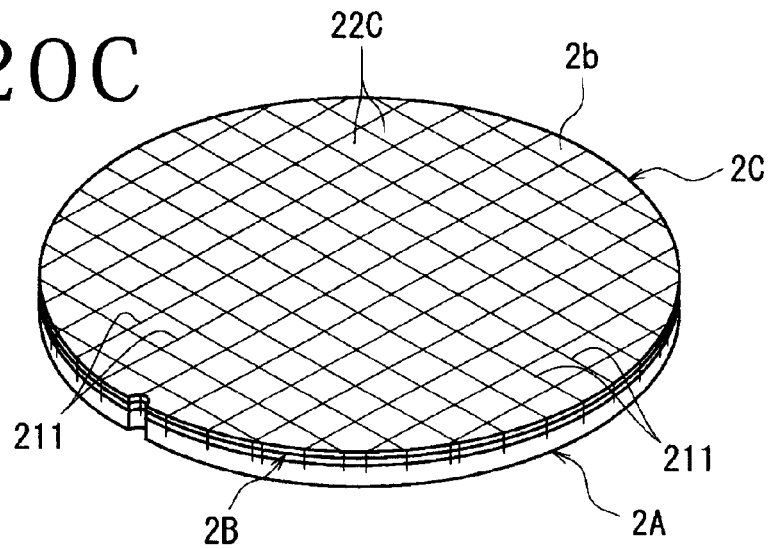
FIG. 20C is a perspective view showing the stacked wafer shown in FIG. 20B.

After performing the second stacking step, a second back grinding step is performed in the following manner. The back side of the third wafer stacked to the second wafer by the second stacking step is ground to reduce the thickness of the third wafer to a predetermined finished thickness. This second back grinding step is similar to the second back grinding step in the first preferred embodiment. Accordingly, as shown in FIGS. 20A to 20C, the back side 2b of the semiconductor wafer 2C is ground to reduce the thickness of the semiconductor wafer 2C to a predetermined finished thickness, so that the modified layer 211 formed along each street 21 of the semiconductor wafer 2C is exposed to the back side 2b of the semiconductor wafer 2C.

Figure 21:
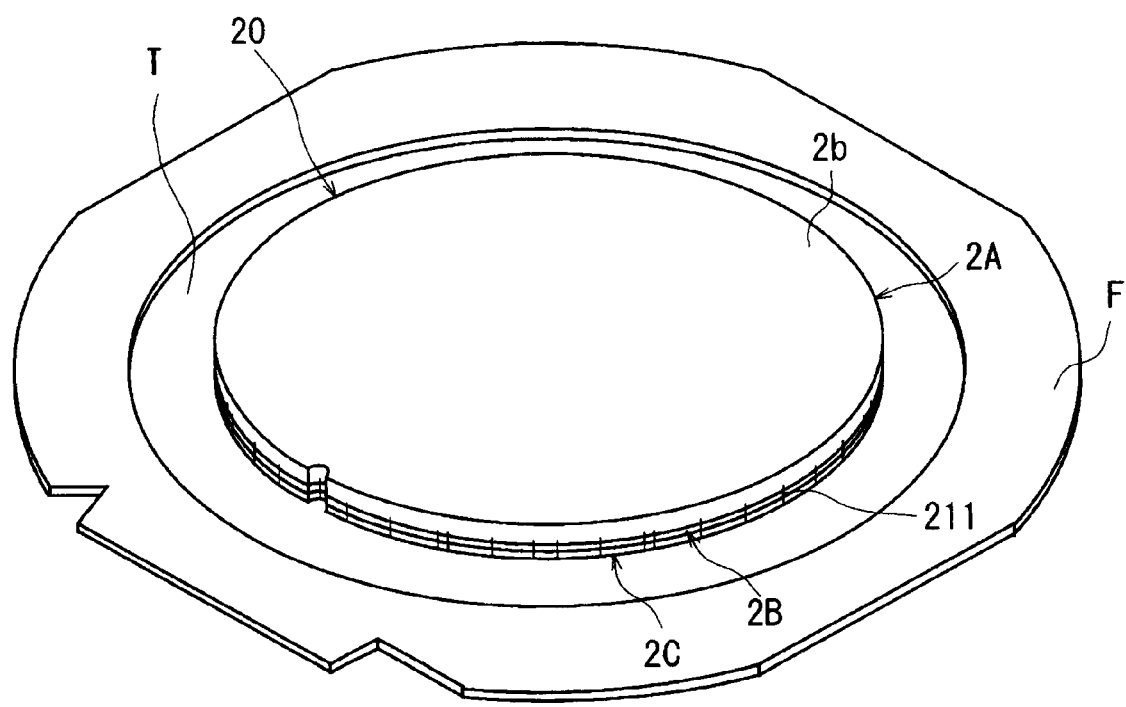
FIG. 21 is a perspective view showing a wafer supporting step in the second preferred embodiment of the stacked device manufacturing method according to the present invention.

After performing the second back grinding step, a wafer supporting step is performed in such a manner that the back side 2b of the semiconductor wafer 2C of the stacked wafer 20 is attached to a dicing tape T supported to an annular frame F as shown in FIG. 21. Accordingly, the back side 2b of the semiconductor wafer 2A as a base wafer of the stacked wafer 20 attached to the front side (upper surface) of the dicing tape T is oriented upward.

Figure 22A:
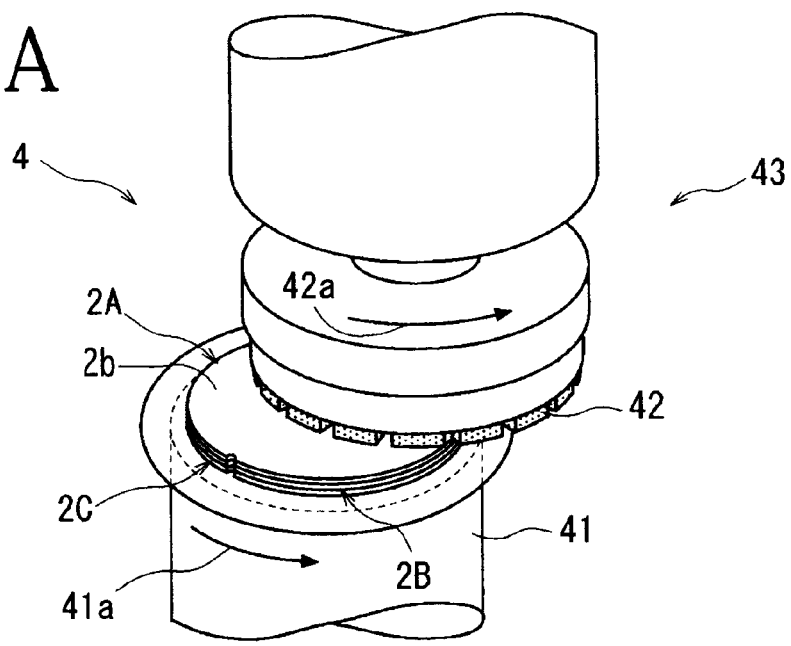
FIG. 22A is a perspective view showing a grinding apparatus for performing a third back grinding step in the second preferred embodiment of the stacked device manufacturing method according to the present invention.
Figure 22B:
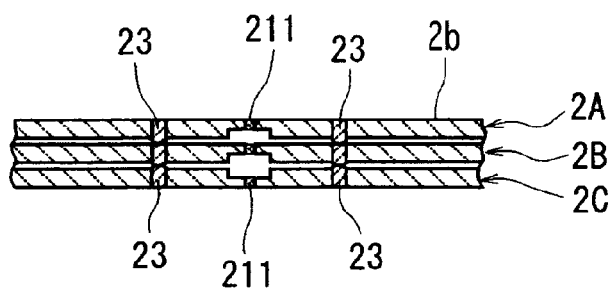
FIG. 22B is an enlarged sectional view showing an essential part of a stacked wafer obtained by the third back grinding step using the grinding apparatus shown in FIG. 22A.
Figure 22C:
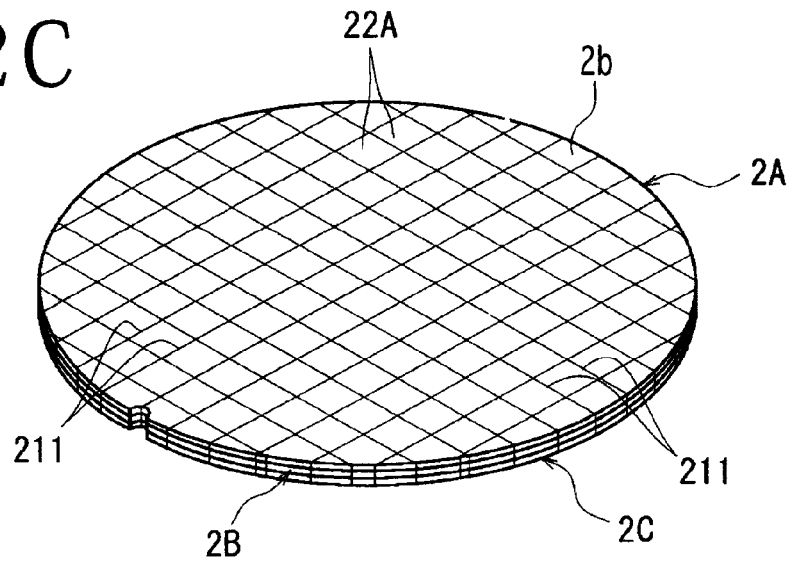
FIG. 22C is a perspective view showing the stacked wafer shown in FIG. 22B.

Next, a third back grinding step is performed in the following manner. The back side of the first wafer as a base wafer of the stacked wafer 20 attached to the front side of the dicing tape T is ground to reduce the thickness of the first wafer to a predetermined finished thickness. This third back grinding step is similar to the third back grinding step in the first preferred embodiment. Accordingly, as shown in FIGS. 22A to 22C, the back side 2b of the semiconductor wafer 2A as a base wafer is ground to reduce the thickness of the semiconductor wafer 2A to a predetermined finished thickness, so that the modified layer 211 formed along each street 21 of the semiconductor wafer 2A is exposed to the back side 2b of the semiconductor wafer 2A.

Figure 23A:
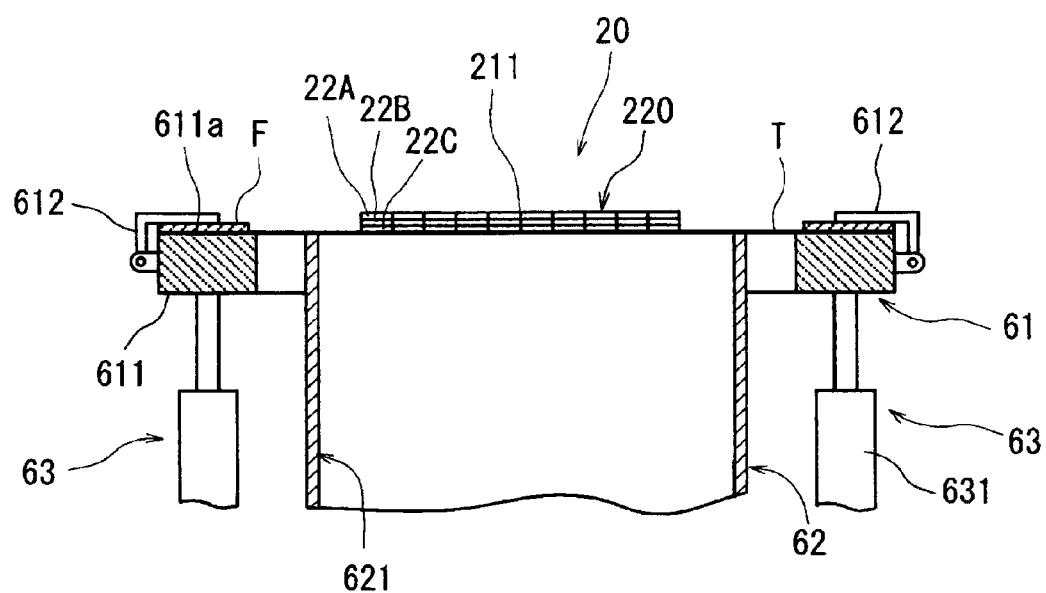
FIGS. 23A and 23B are sectional views showing a dividing step in the second preferred embodiment of the stacked device manufacturing method according to the present invention.
Figure 23B:
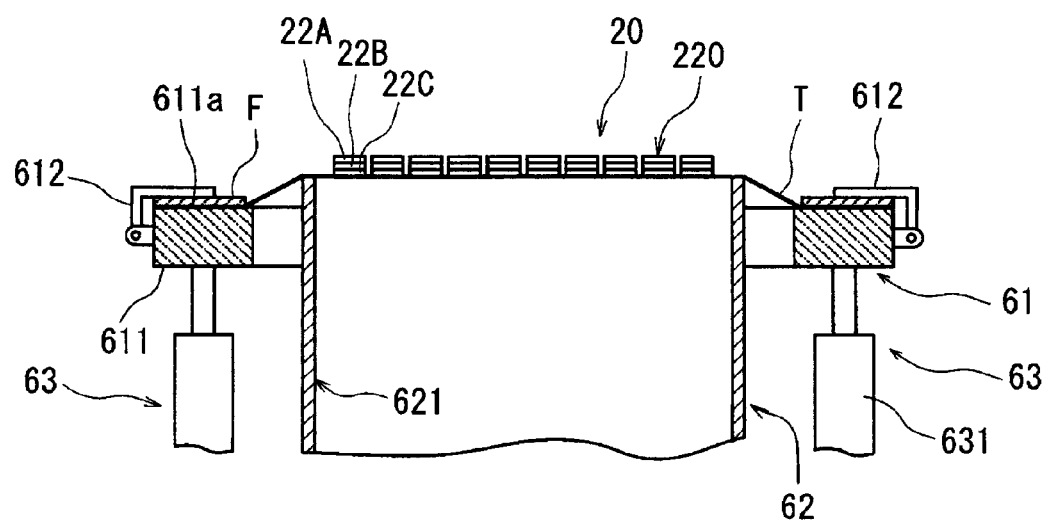

After performing the third back grinding step, a dividing step is performed in the following manner. An external force is applied to the stacked wafer 20 after performing the third back grinding step to thereby divide the stacked wafer 20 along the modified layers formed in each wafer. This dividing step may be performed by using the tape expanding apparatus 6 shown in FIG. 13. That is, as shown in FIG. 23A, the annular frame F supporting the stacked wafer 20 through the dicing tape T is mounted on the mounting surface 611a of the frame holding member 611 of the frame holding means 61 and fixed to the frame holding member 611 by the clamps 612. At this time, the frame holding member 611 is set at the reference position shown in FIG. 23A. Thereafter, the air cylinders 631 as the supporting means 63 of the tape expanding means 62 are operated to lower the frame holding member 611 to the expansion position shown in FIG. 23B. Accordingly, the annular frame F fixed to the mounting surface 611a of the frame holding member 611 is also lowered, so that the dicing tape T supported to the annular frame F comes into abutment against the upper end of the expanding drum 621 and is expanded substantially in the radial direction of the expanding drum 621 as shown in FIG. 23B.

As a result, a tensile force is radially applied to the stacked wafer 20 attached to the dicing tape T, and each semiconductor wafer 2 constituting the stacked wafer 20 is therefore broken along each modified layer 211 reduced in strength. As a result, the stacked wafer 20 is divided into individual stacked devices 220 each composed of the devices 22A, 22B, and 22C as shown in FIG. 23B. Also in the case that the front side 2a of the semiconductor wafer 2B is bonded through an anisotropic conductive adhesive to the front side 2a of the semiconductor wafer 2A as a base wafer in the first stacking step and that the front side 2a of the semiconductor wafer 2C is bonded through an anisotropic conductive adhesive to the back side 2b of the semiconductor wafer 2B in the second stacking step, these anisotropic conductive adhesives are broken along each modified layer 211 by performing the dividing step mentioned above.

Also in this preferred embodiment, the stacked device 220 is manufactured by stacking the semiconductor wafers 2 and next grinding the back side 2b of each semiconductor wafer 2, so that the lamination of the semiconductor wafers 2 can be easily performed and the thickness of each semiconductor wafer 2 can be reduced. Accordingly, the thickness of the stacked device 220 can be minimized.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A stacked device manufacturing method for manufacturing a plurality of individual stacked devices by stacking a plurality of wafers to form a stacked wafer and next dividing said stacked wafer into said individual stacked devices along a plurality of crossing streets formed on the front side of each wafer, wherein each wafer has a plurality of devices respectively formed in a plurality of regions partitioned by said streets and a plurality of electrodes extending from the front side to the back side of each region, said stacked device manufacturing method comprising:

a kerf forming step of forming a kerf on the front side of each wafer along each street prior to grinding the back side of each wafer to thereby reduce the thickness of each wafer to a predetermined finished thickness, said kerf having a depth corresponding to said predetermined finished thickness from the front side of each wafer;

a first stacking step of stacking a first one of said wafers and a second one of said wafers after performing said kerf forming step in such a manner that the front side of said second wafer is opposed to the front side of said first wafer and that said electrodes of said second wafer are respectively bonded to said electrodes of said first wafer;

a first back grinding step of grinding the back side of said second wafer to expose each kerf of said second wafer to the back side of said second wafer after performing said first stacking step;

a second stacking step of stacking a third one of said wafers subjected to said kerf forming step to said second wafer after performing said first back grinding step in such a manner that the front side of said third wafer is opposed to the back side of said second wafer and that said electrodes of said third wafer are respectively bonded to said electrodes of said second wafer;

a second back grinding step of grinding the back side of said third wafer to expose each kerf of said third wafer to the back side of said third wafer after performing said second stacking step; and a third back grinding step of grinding the back side of said first wafer to expose each kerf of said first wafer to the back side of said first wafer after performing said second back grinding step.

2. The stacked device manufacturing method according to claim 1, wherein the front side of said second wafer stacked on the front side of said first wafer is bonded thereto through an adhesive in said first stacking step, and, in said second stacking step, the front side of said third wafer subjected to said kerf forming step is bonded through an adhesive to the back side of said second wafer subjected to said first back grinding step.

3. The stacked device manufacturing method according to claim 2, further comprising an adhesive separating step of separating said adhesive filled in each kerf of each of said first to third wafers after performing said third back grinding step.

4. The stacked device manufacturing method according to claim 1, wherein said second stacking step and said second back grinding step are repeated.

5. The stacked device manufacturing method according to claim 1, further comprising a wafer supporting step of attaching the back side of said third wafer to the front side of a dicing tape supported to an annular frame after performing said second back grinding step and before performing said third back grinding step.

6. A stacked device manufacturing method for manufacturing a plurality of individual stacked devices by stacking a plurality of wafers to form a stacked wafer and next dividing said stacked wafer into said individual stacked devices along a plurality of crossing streets formed on the front side of each wafer, wherein each wafer has a plurality of devices respectively formed in a plurality of regions partitioned by said streets and a plurality of electrodes extending from the front side to the back side of each region, said stacked device manufacturing method comprising:

a modified layer forming step of applying a laser beam to each wafer along each street to thereby form a modified layer in each wafer along each street so that said modified layer is exposed to the front side of each wafer, prior to grinding the back side of each wafer to thereby reduce the thickness of each wafer to a predetermined finished thickness;

a first stacking step of stacking a first one of said wafers and a second one of said wafers after performing said modified layer forming step in such a manner that the front side of said second wafer is opposed to the front side of said first wafer and that said electrodes of said second wafer are respectively bonded to said electrodes of said first wafer;

a first back grinding step of grinding the back side of said second wafer to reduce the thickness of said second wafer to said predetermined finished thickness after performing said first stacking step;

a second stacking step of stacking a third one of said wafers subjected to said modified layer forming step to said second wafer after performing said first back grinding step in such a manner that the front side of said third wafer is opposed to the back side of said second wafer and that said electrodes of said third wafer are respectively bonded to said electrodes of said second wafer;

a second back grinding step of grinding the back side of said third wafer to reduce the thickness of said third wafer to said predetermined finished thickness after performing said second stacking step;

a third back grinding step of grinding the back side of said first wafer to reduce the thickness of said first wafer to said predetermined finished thickness after performing said second back grinding step; and a dividing step of applying an external force to said stacked wafer after performing said third back grinding step to thereby divide said stacked wafer along each modified layer formed in each of said first to third wafers.

7. The stacked device manufacturing method according to claim 6, wherein the front side of said second wafer stacked on the front side of said first wafer is bonded thereto through an adhesive in said first stacking step, and, in said second stacking step, the front side of said third wafer subjected to said modified layer forming step is bonded through an adhesive to the back side of said second wafer subjected to said first back grinding step.

8. The stacked device manufacturing method according to claim 6, wherein said second stacking step and said second back grinding step are repeated.

9. The stacked device manufacturing method according to claim 6, further comprising a wafer supporting step of attaching the back side of said third wafer to the front side of a dicing tape supported to an annular frame after performing said second back grinding step and before performing said third back grinding step.

* * * * *